(12) United States Patent
Vrazel et al.

(10) Patent No.: US 7,173,551 B2
(45) Date of Patent: Feb. 6, 2007

(54) INCREASING DATA THROUGHPUT IN OPTICAL FIBER TRANSMISSION SYSTEMS

(75) Inventors: Michael G. Vrazel, Atlanta, GA (US); Stephen E. Ralph, Atlanta, GA (US); Joy Laskar, Atlanta, GA (US); Sungyong Jung, Marietta, GA (US); Vincent Mark Hietala, Albuquerque, NM (US); Edward Gebara, Atlanta, GA (US)

(73) Assignee: Quellan, Inc., Atlanta, GA (US)

( * ) Notice: Subject to any disclaimer, the term of this patent is extended or adjusted under 35 U.S.C. 154(b) by 773 days.

(21) Appl. No.: 10/032,586

(22) Filed: Dec. 21, 2001

(65) Prior Publication Data

US 2002/0167693 A1 Nov. 14, 2002

Related U.S. Application Data

(60) Provisional application No. 60/304,718, filed on Jul. 11, 2001, provisional application No. 60/289,674, filed on May 9, 2001, provisional application No. 60/286,070, filed on Apr. 24, 2001, provisional application No. 60/284,964, filed on Apr. 19, 2001, provisional application No. 60/284,949, filed on Apr. 19, 2001, provisional application No. 60/284,457, filed on Apr. 19, 2001, provisional application No. 60/281,526, filed on Apr. 4, 2001, provisional application No. 60/279,916, filed on Mar. 29, 2001.

(51) Int. Cl.
*H03M 1/66* (2006.01)

(52) U.S. Cl. .......................... 341/144; 341/61

(58) Field of Classification Search ................ 341/144, 341/61; 372/38.02, 20; 398/87, 9; 359/245
See application file for complete search history.

(56) References Cited

U.S. PATENT DOCUMENTS 2,632,058 A 3/1953 Gray
(Continued)

FOREIGN PATENT DOCUMENTS

EP 0 527 966 B1 9/1994
(Continued)

OTHER PUBLICATIONS

International Search Report for PCT Application No. PCT/US03/35887 dated Jun. 4, 2004.
(Continued)

*Primary Examiner*—Jean Bruner Jeanglaude
(74) *Attorney, Agent, or Firm*—King & Spalding LLP

(57) ABSTRACT

Data throughput rates are increased in an optical fiber communication system without requiring replacement of the existing optical fiber in a link. Channel throughput is increased by upgrading the components and circuitry in the head and terminal of an optical fiber communication system link. Aggregate throughput in a fiber optic link is increased beyond the range of conventional Wavelength Division Multiplexed (WDM) upgrades, while precluding the necessity of replacing existing fiber plants. The increase in system throughput is achieved by using advanced modulation techniques to encode greater amounts of data into the transmitted spectrum of a channel, thereby increasing the spectral efficiency of each channel. This novel method of increasing transmission capacity by upgrading the head and terminal of the system to achieve greater spectral efficiency and hence throughput, alleviates the need to replace existing fiber plants. Spectrally efficient complex modulation techniques can be supported by interface circuits with an increased level of signal processing capability in order to both encode multiple bits into a transmitted symbol and decode the original data from the received symbols.

47 Claims, 25 Drawing Sheets

U.S. PATENT DOCUMENTS

| | | |
|---|---|---|
| 3,445,771 A | 5/1969 | Clapham et al. |
| 3,571,725 A | 3/1971 | Kaneko et al. |
| 3,599,122 A | 8/1971 | Leuthoki ..................... 333/29 |
| 3,633,108 A | 1/1972 | Kneuer ........................ 325/323 |
| 3,714,437 A | 1/1973 | Kinsel |
| 3,806,915 A | 4/1974 | Higgins et al. |
| 3,977,795 A | 8/1976 | Buschmann |
| 4,201,909 A | 5/1980 | Dogliotti et al. ............ 455/608 |
| 4,287,756 A | 9/1981 | Gallagher |
| 4,288,872 A | 9/1981 | Tamburelli ................... 375/14 |
| 4,349,914 A | 9/1982 | Evans |
| 4,363,127 A | 12/1982 | Evans et al. |
| 4,386,339 A | 5/1983 | Henry et al. |
| 4,387,461 A | 6/1983 | Evans |
| 4,393,499 A | 7/1983 | Evans |
| 4,410,878 A | 10/1983 | Stach ......................... 340/347 |
| 4,464,771 A | 8/1984 | Sorenson |
| 4,470,126 A | 9/1984 | Haque |
| 4,475,227 A | 10/1984 | Belfield ....................... 381/30 |
| 4,479,266 A | 10/1984 | Eumurian et al. |
| 4,521,883 A | 6/1985 | Roché |
| 4,580,263 A | 4/1986 | Watanabe et al. |
| 4,584,720 A | 4/1986 | Garrett |
| 4,618,941 A | 10/1986 | Linder et al. |
| 4,646,173 A | 2/1987 | Kammeyer et al. ........... 360/51 |
| 4,651,026 A | 3/1987 | Serfaty et al. |
| 4,751,497 A | 6/1988 | Torii |
| 4,830,493 A | 5/1989 | Giebeler |
| 4,847,521 A | 7/1989 | Huignard et al. |
| 4,864,590 A | 9/1989 | Arnon et al. |
| 4,873,700 A | 10/1989 | Wong .......................... 375/76 |
| 4,912,726 A | 3/1990 | Iwamatsu et al. |
| 4,942,593 A | 7/1990 | Whiteside et al. |
| 4,953,041 A | 8/1990 | Huber ......................... 360/46 |
| 4,959,535 A | 9/1990 | Garrett |
| 4,978,957 A | 12/1990 | Hotta et al. |
| 5,007,106 A | 4/1991 | Kahn et al. |
| 5,008,957 A | 4/1991 | Klyono |
| 5,012,475 A | 4/1991 | Campbell |
| 5,067,126 A | 11/1991 | Moore |
| 5,072,221 A | 12/1991 | Schmidt |
| 5,111,065 A | 5/1992 | Roberge |
| 5,113,278 A | 5/1992 | Degura et al. |
| 5,115,450 A | 5/1992 | Arcuri |
| 5,121,411 A | 6/1992 | Fluharty |
| 5,128,790 A | 7/1992 | Heidemann et al. |
| 5,132,639 A | 7/1992 | Blauvelt et al. |
| 5,151,698 A | 9/1992 | Pophillat |
| 5,181,034 A | 1/1993 | Takakura et al. |
| 5,181,136 A | 1/1993 | Kavehrad et al. |
| 5,184,131 A | 2/1993 | Ikeda |
| 5,208,833 A | 5/1993 | Erhart et al. |
| 5,222,103 A | 6/1993 | Gross |
| 5,223,834 A | 6/1993 | Wang et al. |
| 5,225,798 A | 7/1993 | Hunsinger et al. |
| 5,237,590 A | 8/1993 | Kazawa et al. |
| 5,243,613 A | 9/1993 | Gysel et al. |
| 5,252,930 A | 10/1993 | Blauvelt |
| 5,282,072 A | 1/1994 | Nazarathy et al. |
| 5,283,679 A | 2/1994 | Wedding |
| 5,291,031 A | 3/1994 | MacDonald et al. |
| 5,293,406 A | 3/1994 | Suzuki |
| 5,300,930 A | 4/1994 | Burger et al. |
| 5,321,543 A | 6/1994 | Huber |
| 5,321,710 A | 6/1994 | Cornish et al. |
| 5,327,279 A | 7/1994 | Farina et al. |
| 5,343,322 A | 8/1994 | Pirio et al. |
| 5,351,148 A | 9/1994 | Maeda et al. |
| 5,355,240 A | 10/1994 | Prigent et al. |
| 5,361,156 A | 11/1994 | Pidgeon |
| 5,371,625 A | 12/1994 | Wedding et al. |
| 5,373,384 A | 12/1994 | Hebert |
| 5,376,786 A | 12/1994 | MacDonald |
| 5,382,955 A | 1/1995 | Knierim |
| 5,387,887 A | 2/1995 | Zimmerman et al. |
| 5,408,485 A | 4/1995 | Ries |
| 5,413,047 A | 5/1995 | Evans et al. |
| 5,416,628 A | 5/1995 | Betti et al. |
| 5,418,637 A | 5/1995 | Kuo |
| 5,424,680 A | 6/1995 | Nazarathy et al. |
| 5,428,643 A | 6/1995 | Razzell |
| 5,428,831 A | 6/1995 | Monzello et al. ........... 455/296 |
| 5,436,752 A | 7/1995 | Wedding |
| 5,436,756 A | 7/1995 | Knox et al. |
| 5,444,864 A | 8/1995 | Smith .......................... 455/84 |
| 5,450,044 A | 9/1995 | Hulick |
| 5,481,389 A | 1/1996 | Pidgeon et al. |
| 5,481,568 A | 1/1996 | Yada |
| 5,483,552 A | 1/1996 | Shimazaki et al. .......... 375/233 |
| 5,504,633 A | 4/1996 | Van Den Enden |
| 5,510,919 A | 4/1996 | Wedding |
| 5,515,196 A | 5/1996 | Kitajima et al. |
| 5,528,710 A | 6/1996 | Burton et al. |
| 5,541,955 A | 7/1996 | Jacobsmeyer ............... 375/222 |
| 5,548,253 A | 8/1996 | Durrant |
| 5,557,439 A * | 9/1996 | Alexander et al. ............ 398/87 |
| 5,574,743 A | 11/1996 | van der Poel et al. |
| 5,589,786 A | 12/1996 | Bella et al. |
| 5,606,734 A | 2/1997 | Bahu ......................... 455/303 |
| 5,612,653 A | 3/1997 | Dodds et al. |
| 5,617,135 A | 4/1997 | Noda et al. .................... 348/12 |
| 5,621,764 A | 4/1997 | Ushirokawa et al. |
| 5,625,360 A | 4/1997 | Garrity et al. |
| 5,625,722 A | 4/1997 | Froberg et al. |
| 5,644,325 A | 7/1997 | King et al. |
| 5,648,987 A | 7/1997 | Yang et al. ................. 375/232 |
| 5,670,871 A | 9/1997 | Man et al. |
| 5,675,600 A | 10/1997 | Yamamoto |
| 5,678,198 A | 10/1997 | Lemson |
| 5,689,356 A | 11/1997 | Rainal |
| 5,691,978 A | 11/1997 | Kenworthy ................. 370/278 |
| 5,692,011 A | 11/1997 | Nobakht et al. ............. 375/233 |
| 5,699,022 A | 12/1997 | Tovar .......................... 333/18 |
| 5,706,008 A | 1/1998 | Huntley et al. |
| 5,721,315 A | 2/1998 | Evans et al. |
| 5,723,176 A | 3/1998 | Keyworth et al. |
| 5,751,726 A | 5/1998 | Kim |
| 5,754,681 A | 5/1998 | Watanabe et al. |
| 5,757,763 A | 5/1998 | Green et al. |
| 5,761,243 A | 6/1998 | Russell et al. |
| 5,764,542 A | 6/1998 | Gaudette et al. |
| 5,774,505 A | 6/1998 | Baugh ........................ 375/348 |
| 5,783,630 A | 7/1998 | Evans et al. |
| 5,784,032 A | 7/1998 | Johnston et al. |
| 5,790,595 A | 8/1998 | Benthin et al. |
| 5,798,854 A | 8/1998 | Blauvelt et al. |
| 5,801,657 A | 9/1998 | Fowler et al. |
| 5,802,089 A | 9/1998 | Link |
| 5,812,578 A | 9/1998 | Schemmann et al. |
| 5,825,211 A | 10/1998 | Smith et al. |
| 5,825,257 A | 10/1998 | Klymyshyn et al. |
| 5,825,825 A | 10/1998 | Altmann et al. |
| 5,828,329 A | 10/1998 | Burns |
| 5,835,848 A | 11/1998 | Bi et al. ....................... 455/24 |
| 5,839,105 A | 11/1998 | Ostendorf et al. |
| 5,841,841 A | 11/1998 | Dodds et al. |
| 5,844,436 A | 12/1998 | Altmann |
| 5,848,139 A | 12/1998 | Grover |
| 5,850,409 A | 12/1998 | Link |
| 5,850,505 A | 12/1998 | Grover et al. |
| 5,852,389 A | 12/1998 | Kumar et al. |
| 5,859,862 A | 1/1999 | Hikasa et al. |
| 5,861,966 A | 1/1999 | Ortel |
| 5,872,468 A | 2/1999 | Dyke |

| | | | | | | |
|---|---|---|---|---|---|---|
| 5,878,390 | A | 3/1999 | Kawai et al. | 6,271,690 | B1 | 8/2001 | Hirano et al. ............... 327/75 |
| 5,880,870 | A | 3/1999 | Sieben et al. | 6,271,944 | B1 | 8/2001 | Schemmann et al. |
| 5,883,910 | A | 3/1999 | Link | 6,281,824 | B1 | 8/2001 | Masuda |
| 5,887,022 | A | 3/1999 | Lee et al. | 6,288,668 | B1 | 9/2001 | Tsukamoto et al. |
| 5,889,759 | A | 3/1999 | McGibney | 6,289,055 | B1 | 9/2001 | Knotz |
| 5,896,392 | A | 4/1999 | Ono et al. | 6,289,151 | B1 | 9/2001 | Kazarinov et al. |
| 5,912,749 | A | 6/1999 | Harstead et al. | 6,295,325 | B1 | 9/2001 | Farrow et al. ............. 375/327 |
| 5,920,600 | A | 7/1999 | Yamaoka et al. | 6,297,678 | B1 | 10/2001 | Gholami ................. 327/198 |
| 5,923,226 | A | 7/1999 | Kakura et al. | 6,298,459 | B1 | 10/2001 | Tsukamoto |
| 5,942,576 | A | 8/1999 | Evans et al. | 6,304,199 | B1 | 10/2001 | Fang et al. |
| 5,943,380 | A | 8/1999 | Marchesani et al. | 6,311,045 | B1 | 10/2001 | Domokos ................... 455/78 |
| 5,943,457 | A | 8/1999 | Hayward et al. | 6,313,713 | B1 | 11/2001 | Ho et al. ..................... 333/1.1 |
| 5,949,926 | A | 9/1999 | Davies | 6,314,147 | B1 | 11/2001 | Liang et al. ................ 375/346 |
| 5,959,032 | A | 9/1999 | Evans et al. | 6,317,247 | B1* | 11/2001 | Yang et al. ................. 359/245 |
| 5,959,750 | A | 9/1999 | Eskildsen et al. | 6,317,469 | B1 | 11/2001 | Herbert |
| 5,965,667 | A | 10/1999 | Evans et al. | 6,341,023 | B1 | 1/2002 | Puc |
| 5,968,198 | A | 10/1999 | Hassan et al. | 6,356,374 | B1 | 3/2002 | Farhan ..................... 359/180 |
| 5,978,417 | A | 11/1999 | Baker et al. ............. 375/232 | 6,388,786 | B1 | 5/2002 | Ono et al. |
| 5,983,178 | A | 11/1999 | Naito et al. | 6,411,117 | B1 | 6/2002 | Hatamian .................. 324/765 |
| 5,985,999 | A | 11/1999 | Dominguez et al. | 6,421,155 | B1 | 7/2002 | Yano |
| 5,995,565 | A | 11/1999 | Tong et al. ............... 375/346 | 6,445,476 | B1 | 9/2002 | Kahn et al. ................ 359/184 |
| 5,999,300 | A | 12/1999 | Davies et al. | 6,473,131 | B1 | 10/2002 | Neugebauer et al. |
| 6,002,274 | A | 12/1999 | Smith et al. | 6,501,792 | B2 | 12/2002 | Webster |
| 6,002,717 | A | 12/1999 | Gaudet | 6,539,204 | B1 | 3/2003 | Marsh et al. ................. 455/63 |
| 6,009,424 | A | 12/1999 | Lepage et al. | 6,560,257 | B1* | 5/2003 | DeSalvo et al. ......... 372/38.02 |
| 6,011,952 | A | 1/2000 | Dankberg et al. ............. 455/24 | 6,665,348 | B1 | 12/2003 | Feher ........................ 375/259 |
| 6,021,110 | A | 2/2000 | McGibney | 6,665,500 | B2 | 12/2003 | Snawerdt |
| 6,028,658 | A | 2/2000 | Hamada et al. | 6,718,138 | B1 | 4/2004 | Sugawara ..................... 398/9 |
| 6,031,048 | A | 2/2000 | Evans et al. | 6,751,587 | B2 | 6/2004 | Thyssen et al. ............. 704/228 |
| 6,031,866 | A | 2/2000 | Oler et al. | 6,816,101 | B2 | 11/2004 | Hietala et al. ............. 341/155 |
| 6,031,874 | A | 2/2000 | Chennakeshu et al. | 6,819,166 | B1 | 11/2004 | Choi et al. ................. 327/551 |
| 6,034,996 | A | 3/2000 | Herzberg | 6,961,019 | B1 | 11/2005 | McConnell et al. ..... 342/357.1 |
| 6,035,080 | A | 3/2000 | Henry et al. | 7,035,361 | B2 | 4/2006 | Kim et al. ................. 375/350 |
| 6,041,299 | A | 3/2000 | Schuster et al. | 7,050,388 | B2 | 5/2006 | Kim et al. ................. 370/201 |
| 6,052,420 | A | 4/2000 | Yeap et al. ................ 375/346 | 2001/0024542 | A1* | 9/2001 | Aina et al. |
| 6,072,364 | A | 6/2000 | Jeckeln et al. | 2002/0086640 | A1 | 7/2002 | Belcher et al. ............... 455/63 |
| 6,072,615 | A | 6/2000 | Mamyshev | 2002/0196508 | A1 | 12/2002 | Wei et al. |
| 6,078,627 | A | 6/2000 | Crayford | 2003/0002121 | A1 | 1/2003 | Miyamoto et al. |
| 6,084,931 | A | 7/2000 | Powell, II et al. | 2003/0008628 | A1 | 1/2003 | Lindell et al. ........... 455/180.1 |
| 6,091,782 | A | 7/2000 | Harano | 2003/0030873 | A1* | 2/2003 | Hietala et al. |
| 6,093,496 | A | 7/2000 | Dominguez et al. | 2003/0053534 | A1 | 3/2003 | Sivadas et al. ............. 375/229 |
| 6,093,773 | A | 7/2000 | Evans et al. | 2003/0058976 | A1 | 3/2003 | Ohta et al. ................. 375/350 |
| 6,108,474 | A | 8/2000 | Eggleton et al. | 2003/0063354 | A1* | 4/2003 | Davidson |
| 6,111,477 | A | 8/2000 | Klymyshyn et al. | 2003/0067990 | A1 | 4/2003 | Bryant ....................... 375/259 |
| 6,118,563 | A | 9/2000 | Boskovic et al. | 2004/0197103 | A1* | 10/2004 | Roberts et al. |
| 6,118,567 | A | 9/2000 | Alameh et al. | 2004/0213354 | A1 | 10/2004 | Jones et al. ................. 375/285 |
| 6,127,480 | A | 10/2000 | Dominguez et al. | 2004/0218756 | A1 | 11/2004 | Tang et al. ................. 379/417 |
| 6,140,416 | A | 10/2000 | Evans et al. | 2005/0069063 | A1 | 3/2005 | Waltho et al. .............. 375/346 |
| 6,140,858 | A | 10/2000 | Dumont | | | | |
| 6,140,972 | A | 10/2000 | Johnston et al. | | | | |
| 6,141,127 | A | 10/2000 | Boivin et al. | | | | |

FOREIGN PATENT DOCUMENTS

| | | |
|---|---|---|
| 6,141,387 A | 10/2000 Zhang | |
| 6,148,428 A | 11/2000 Welch et al. | EP  0 584 865 B1  3/2000 |
| 6,151,150 A | 11/2000 Kikuchi | GB  2 223 369 A  4/1990 |
| 6,154,301 A | 11/2000 Harvey | GB  2 306 066 A  4/1997 |
| 6,163,638 A | 12/2000 Eggleton et al. | JP  62082659  10/1988 |
| 6,169,764 B1  1/2001 Babanezhad ............. 375/233 | | JP  1990000063162  11/1991 |
| 6,169,912 B1  1/2001 Zuckerman ............... 455/570 | | JP  04187738  7/1992 |
| 6,181,454 B1  1/2001 Nagahori et al. | | JP  08079186 A  3/1996 |
| 6,191,719 B1  2/2001 Bult et al. | | WO  WO/2006/065883 A2  9/1994 |
| 6,201,916 B1  3/2001 Eggleton et al. | | WO  WO 99/45683  9/1999 |
| 6,208,792 B1  3/2001 Hwang et al. | | WO  WO 01/41346 A2  6/2001 |
| 6,211,978 B1*  4/2001 Wojtunik ..................... 398/9 | | WO  WO 02/067521 A1  8/2002 |
| 6,212,654 B1  4/2001 Lou et al. | | WO  WO 2002/082694 A1  10/2002 |
| 6,214,914 B1  4/2001 Evans et al. | | WO  WO 02/091600 A2  11/2002 |
| 6,215,812 B1  4/2001 Young et al. ............... 375/144 | | WO  WO 2003/071731 A1  8/2003 |
| 6,219,633 B1  4/2001 Lepage | | WO  WO 03/077423 A2  9/2003 |
| 6,222,861 B1*  4/2001 Kuo et al. ................... 372/20 | | WO  WO 03/092237 A2  11/2003 |
| 6,226,112 B1  5/2001 Denk et al. | | WO  WO 2004/008782 A2  1/2004 |
| 6,236,963 B1  5/2001 Naito et al. | | WO  WO 2004/045078 A2  5/2004 |
| 6,259,836 B1  7/2001 Dodds | | WO  WO 2004/088857 A2  10/2004 |
| 6,259,847 B1  7/2001 Lenz et al. | | WO  WO 2005/018134 A2  2/2005 |
| 6,268,816 B1  7/2001 Bult et al. | | |

WO WO 2005/05089 A2 6/2005

OTHER PUBLICATIONS

International Preliminary Examination Report for PCT Application No. PCT/US03/12422 dated Jul. 8, 2004.

Choi et al.; *A 0.18-μm CMOS 3.5-Gb/s Continuous-Time Adaptive Cable Equalizer Using Enhanced Low-Frequency Gain Control Method*; IEEE Journal of Solid-State Circuits; Mar. 2004; vol. 39, No. 3; pp. 419-425.

Paul, et al.; *3 Gbit/s Optically Preamplified Direct Detection DPSK Receiver With 116 photon/bit Sensitivity*; Electronics Letters; vol. 29, No. 7; Apr. 1, 1993; pp. 614-615.

Penninckx et al.; *Optical Differential Phase Shift Keying (DPSK) Direct Detection Considered as a Duobinary Signal*; Proc. 27th Eur. Conf. on Opt. Comm. (ECOC'01—Amsterdam); vol. 3; Sep. 30 to Oct. 4, 2001; pp. 456-457.

Rohde et al.; *Robustness of DPSK Direct Detection Transmission Format in Standard Fibre WDM Systems*; Electronics Letters; vol. 36, No. 17; Aug. 17, 2000; pp. 1483-1484.

Shirasaki et al.; *Fibre Transmission Properties of Optical Pulses Produced Through Direct Phase Modulation of DFB Laser Diode*; Electronics Letters; vol. 24, No. 8; Apr. 14, 1988; pp. 486-488.

International Search Report dated Sep. 26, 2002; International Application No. PCT/US02/14459.

International Search Report dated May 29, 2003 for International Application No. PCT/US03/04626.

Kannangara et al.; *Adaptive Duplexer for Multiband Transceiver*; Radio and Wireless Conference; Aug. 10-13, 2003; RAWCON '03; pp. 381-384.

Kannangara et al.; *Adaptive Duplexer for Software Radio*; Approximate Date: Nov. 11-13, 2002.

Kannangara et al.; *An Algorithm to Use in Adaptive Wideband Duplexer for Software Radio*; IEICE Transactions on Communications; Dec. 2003; vol. E86-B, No. 12; pp. 3452-3455.

Kannangara et al.; *Performance Analysis of the Cancellation Unit in an Adaptive Wideband Duplexer for Software Radio*; ATcrc Telecommunications and Networking Conference & Workshop, Melbourne, Australia, Dec. 11-12, 2003.

Williamson et al., *Performance Analysis of Adaptive Wideband Duplexer*; 2003 Australian Telecommunications, Networks and Applications Conference (ATNAC); Dec. 8-10, 2003.

Weger et al.; *Gilbert Multiplier as an Active Mixer with Conversion Gain Bandwidth of up to 17GHz*; Electronics Letters; Mar. 28, 1991; vol. 27, No. 7; pp. 570-571.

Chi et al.; *Transmission Performance of All-Optically Labelled Packets Using ASK/DPSK Orthogonal Modulation*; The 15th Annual Meeting of the IEEE Lasers and Electro-Optics Society, 2002; LEOS 2002; Nov. 10-14, 2002; vol. 1:51-52. The whole document.

Chiang et al.; *Implementation of STARNET: A WDM Computer Communications Network*; IEEE Journal on Selected Areas in Communications; Jun. 1996; vol. 14, No. 5; pp. 824-839.

Kaess et al.; *New Encoding Scheme for High-Speed Flash ADC's*; IEEE International Symposium on Circuits and Systems; Jun. 9-12, 1997; Hong Kong; pp. 5-8.

Kaiser et al.; *Reduced Complexity Optical Duobinary 10-Gb/s Transmitter Setup Resulting in an Increased Transmission Distance*; IEEE Photonics Technology Letters; Aug. 2001; vol. 13; No. 8; pp. 884-886.

Ohm et al.; *Quaternary Optical ASK-DPSK and Receivers with Direct Detection*; IEEE Photonics Technology Letters; Jan. 2003; vol. 15, No. 1; pp. 159-161.

Runge et al.; *High-Speed Circuits for Lightwave Communications*; 1999; World Scientific, pp. 181-184, no month.

Vodhanel et al.; *Performance of Directly Modulated DFB Lasers in 10-Gb/s ASK, FSK, and DPSK Lightwave Systems*; Journal of Lightwave Technology; Sep. 1990; vol. 8, No. 9; pp. 1379-1386.

Wakimoto et al.; *Si Bipolar 2-GHz 6-bit Flash A/D Conversion LSI*; IEEE Journal of Solid-State Circuits; Dec. 1988; vol. 23, No. 6; pp. 1345-1350.

Westphal et al.; *Lightwave Communications*; 1994; Thursday Afternoon/CLEO '94; pp. 337-338, no month.

Fürst et al.; *Performance Limits of Nonlinear RZ and NRZ Coded Transmission at 10 and 40 Gb/s on Different Fibers*; pp. 302-304, no date.

Garrett, Ian; *Pulse-Position Modulation for Transmission Over Optical Fibers with Direct or Heterodyne Detection*; IEEE Transactions on Communications; vol. COM-31; No. 4; Apr. 1983; pp. 518-527.

Idler et al.; *40 Gbit/s Quaternary Dispersion Supported Transmission Field Trial Over 86 km Standard Singlemode Fibre*; 24th European Conference on Optical Communication; Sep. 1998; pp. 145-147.

Ohtsuki et al.; *BER Performance of Turbo-Coded PPM CDMA Systems on Optical Fiber*; Journal of Lightwave Technology; vol. 18; No. 12; Dec. 2000; pp. 1776-1784.

Vorenkamp et al.; *A 1Gs/s, 10b Digital-to-Analog Converter*; ISSCC94/Session 3/Analog Techniquest/Paper WP 3.3; pp. 52-53, no date.

Walkin et al.; *A 10 Gb/s 4-ary ASK Lightwave System*; ECOC; 1997; pp. 255-258, no month.

Walkin et al.; *Multilevel Signaling for Extending the Dispersion-Limited Transmission in High-Speed, Fiber Optic Communication Systems*; IEEE; 1996; pp. 233-236, no date.

Walklin et al.; *Multilevel Signaling for Increasing the Reach of 10 Gb/s Lightwave Systems*; IEEE Journal of Lightwave Technology; vol. 17; No. 11; Nov. 1999; pp. 2235-2248.

Wedding et al.; *Multi-level Dispersion Supported Transmission at 20 Gbit/s Over 46 km Installed Standard Singlemode Fibre*; 22nd European Conference on Optical Communication; 1996; pp. 91-94, no month.

André; *InP DHBT Technology and Design Methodology for High-Bit-Rate Optical Communications Circuits*; IEEE Journal of Solid-State Circuits; vol. 33, No. 9, Sep. 1998; pp. 1328-1335.

Borjak et al.; *High-Speed Generalized Distributed-Amplifier-Based Transversal-Filter Topology for Optical Communication Systems*; IEEE Transactions on Microwave Theory and Techniques; vol. 45, No. 8; Aug. 1997; pp. 1453-1457.

Buchali et al.; *Fast Eye Monitor for 10 Gbit/s and its Application for Optical PMD Compensation*; Optical Society of America; (2000); pp. TuP5-1-TuP1-3, no month.

Cartledge et al.; *Performance of Smart Lightwave Receivers With Linear Equalization*; Journal of Lightwave Technology; vol. 10, No. 8; Aug. 1992; pp. 1105-1109.

Cimini et al.; *Can Multilevel Signaling Improve the Spectral Efficiency of ASK Optical FDM Systems?*; IEEE Transactions on Communications; vol. 41, No. 7; Jul. 1993; pp. 1084-1090.

Downie et al.; *Performance Monitoring of Optical Networks with Synchronous and Asynchronous Sampling*; p. WDD50-1, no month, no date.

Enning et al.; *Design and Test of Novel Integrate and Dump Filter (I&D) for Optical Gbit/s System Applications*; Electronics Letters; (Nov. 21, 1991); vol. 27, No. 24; pp. 2286-2288.

Godin et al.; *A InP DHBT Technology for High Bit-rate Optical Communications Circuits*; IEEE; (1997); pp. 219-222, no month.

Haskins et al.; *FET Diode Linearizer Optimization for Amplifier Predistortion in Digital Radios*; IEEE Microwave and Guided Wave Letters; vol. 10, No. 1; Jan. 2000; pp. 21-23.

Hranilovic et al.; *A Multilevel Modulation Scheme for High-Speed Wireless Infrared Communications*; IEEE; (1999); pp. VI-338-VI-341, no month.

Jutzi, Wilhelm; *Microwave Bandwidth Active Transversal Filter Concept with MESFETs*; IEEE Transactions on Microwave Theory and Technique, vol. MTT-19, No. 9; Sep. 1971; pp. 760-767.

Lee et al.; *Effects of Decision Ambiguity Level on Optical Receiver Sensitivity*; IEEE Photonics Technology Letters; vol. 7, No. 19; Oct. 1995; pp. 1204-1206.

D. Marcuse; *Calculation of Bit-Error Probability for a Lightwave System with Optical Amplifiers and Post-Detection Gaussian Noise*; Journal of Lightwave Technology; vol. 9, No. 4; Apr. 1991; pp. 505-513.

Megherbi et al.; *A GaAs-HBT A/D Gray-code converter*; IEEE; (1997); pp. 209-212, no month.

Nazarathy et al.; Progress in Externally Modulated AM CATV Transmission Systems; Journal of Lightwave Technology; vol. 11, No. 1; Jan. 1993; pp. 82-105.

Oehler et al.; A 3.6 Gigasample/s 5 bit Analog to Digital Converter Using 0.3 μm AlGaAs-HEMT Technology; IEEE; (1993); pp. 163-164, no month.

Ota et al.; High-Speed, Burst-Mode, Packet-Capable Optical Receiver and Instantaneous Clock Recovery for Optical Bus Operation; Journal of Lightwave Technology; vol. 12, No. 2; Feb. 1994; pp. 325-331.

Poulton et al.; An 8-Gsa/s 8-bit ADC System; Symposium on VLSI Circuits Digest of Technical Papers; (1997); pp. 23-24, no month.

Poulton et al.; A 6-b, 4 Gsa/s GaAs HBT ADC; IEEE Journal of Solid-State Circuits; vol. 30, No. 10.; Oct. 1995; pp. 1109-1118.

Poulton et al.; A 6-bit, 4 Gsa/s ADC Fabricated in a GaAs HBT Process; IEEE; (1994); pp. 240-243.

Prasetyo et al.; Application for Amplitude Gain Estimation Techniques for Multilevel Modulation in OFDM Systems; IEEE; (1998); pp. 821-824, no month.

Shtaif et al.; Limits on the Spectral Efficiency of Intensity Modulated Direct Detection Systems with Optical Amplifiers; AT&T Labs Research; pp. MM1-1-MM1-3, no date.

Su et al.; Inherent Transmission Capacity Penalty of Burst-Mode Receiver for Optical Multiaccess Networks; IEEE Photonics Technology Letters; vol. 6, No. 5; May 1994; pp. 664-667.

Wang et al.; Multi-Gb/s Silicon Bipolar Clock Recovery IC; IEEE Journal on Selected Areas in Communications; vol. 9, No. 5; Jun. 1991; pp. 656-663.

Webb, William T.; Spectrum Efficiency of Multilevel Modulation Schemes in Mobile Radio Communications; IEEE Transactions on Communications; vol. 43, No. 8; Aug. 1995; pp. 2344-2349.

Wedding et al.; Fast Adaptive Control for Electronic Equalization of PMD; Optical Society of America; (2000); pp. TuP4-1-TuP4-3, no month.

Wilson et al.; Predistortion of Electroabsorption Modulators for Analog CATV Systems at 1.55 μm; Journal of Lightwave Technology; vol. 15, No. 9; Sep. 1997; pp. 1654-1662.

Author: Unknown; Digital Carrier Modulation Schemes; Title: Unknown; Date: Unknown; pp. 380-442, no date.

* cited by examiner

INCREASING DATA THROUGHPUT IN OPTICAL FIBER TRANSMISSION SYSTEMS

PRIORITY AND RELATED APPLICATIONS

The present application claims priority to provisional patent application entitled, "Method of QAM Generation and Demodulation Techniques," filed on Apr. 19, 2001 and assigned U.S. Application Ser. No. 60/284,457. The present application also claims priority to provisional patent application entitled, "Mixed Signal Processing for Distortion Compensation of Multilevel Optical Communication Signals," filed on Mar. 29, 2001 and assigned U.S. Application Ser. No. 60/279,916. The present application also claims priority to provisional patent application entitled, "Automatic Threshold Tracking and Digitization Method for Multilevel Signals," filed on Apr. 4, 2001 and assigned U.S. Application Ser. No. 60/28 1,526. The present application also claims priority to provisional patent application entitled, "Parallel Noise Filtering for Multi-Level Optical Data Reception," filed on Apr. 24, 2001 and assigned U.S. Application Ser. No. 60/286,070. The present application also claims priority to provisional patent application entitled, "Adaptive Equalizer for Multi-Level Optical Data Receiver," filed on Apr. 19, 2001 and assigned U.S. Application Ser. No. 60/284,949. The present application also claims priority to provisional patent application entitled, "Linearization of Optical Modulation," filed on Apr. 19, 2001 and assigned U.S. Application Ser. No. 60/284,964. The present application also claims priority to provisional patent application entitled, "System and Method for Increasing Throughput in Optical Fiber Transmission Systems," filed on Jul. 11, 2001 and assigned U.S. Application Ser. No. 60/304,718. The present application also claims priority to provisional patent application entitled, "High-Speed Multilevel Light Modulator Driver Circuit," filed on May 9, 2001 and assigned U.S. Application Serial No. 60/289,674.

FIELD OF THE INVENTION

The present invention relates to optical fiber communication systems and more particularly relates to increasing the throughput of data transmission over an optical fiber communication system through the use of multilevel modulation.

BACKGROUND OF THE INVENTION

In virtually all fields of communications, there exists a persistent demand to transmit more data in less time. The amount of information that can be transmitted over a communications system (or through a component of that system) is referred to as the bit rate or the data throughput of the system. Traditionally, system throughput is increased by either increasing the number of channels carrying information or increasing the bit rate of each channel. In order to meet ever-increasing bandwidth demands, aggregate throughput in fiber optic transmission systems has conventionally been increased by using multiple Wavelength Division Multiplexed (WDM) channels, time-division-multiplexing (TDM), or some combination of the two techniques. WDM techniques increase the number of channels transmitted on a particular fiber, while TDM techniques increase the data rate of each individual channel.

Conventional optical fiber networks typically can deliver on the order of 10 Gigabits of data per second (10 Gb/s). Both WDM and TDM techniques have been applied to realize fiber channel bit rates well above this conventional 10 Gb/s capacity. Many fiber optic communication systems comprise multiple WDM channels simultaneously transmitted through a single optical fiber. Each of these channels operates independently at a given bit rate, B. Thus for an m channel WDM system, the system throughput is equal to m·B. Conventional dense WDM (DWDM) systems typically operate with 40 to 100 channels. There are certain restrictions, however, that limit the aggregate power that can be transmitted through a single DWDM optical fiber (i.e., the launch power). For example, eye safety power regulations and nonlinear effects in the fiber place limits on the aggregate launch power. In addition, channel spacing limitations and per-channel launch power, effectively limit the number of WDM channels that can be combined for transmission on a single fiber.

TDM techniques also are associated with various limitations. For example, using conventional TDM techniques to achieve an n-times increase in channel data rates requires the optical components of a link (e.g., the modulator and photodetector) to be replaced with new optical components having n-times the bandwidth of the original optical components. In addition, the interface circuitry must be replaced with new circuitry having bandwidth n-times greater than the original circuits.

Optical fiber networks are typically comprised of a series of links that include a transmission block, a receiver block, and a long stretch of optical fiber connecting the two blocks (i.e., the optical plant). FIG. 1 is a block diagram of a conventional m-channel WDM fiber optic transmission system link 100. The fiber optic transmission system link 100 consists of a WDM transmission block 102 (denoted as the "Head"), the optical fiber 104, and a WDM reception block 106 (denoted as the "Terminal"). The Head 102 comprises m transmitters 108–112 (labeled "Tx") and an m-channel WDM multiplexer 114. Each transmitter 108–112 comprises an optical source (not shown) and all circuitry necessary to modulate the source with the incoming data stream. For the case of external modulation, the transmitter block also includes a modulator. The Terminal 106 comprises an m-channel WDM demultiplexer 116 and m receivers 118–122 (labeled "Rx"). Each receiver 118–122 comprises a photodetector (not shown) and all circuitry required to operate the detector and amplify the detected signal in order to output the original electrical data stream.

In order to realize channel data rates of 10 Gb/s and beyond, the optical fiber 104 as well as the Head 102 and Terminal 106 of the link 100 are typically upgraded to support the increased data rates. In order to increase the channel bit rates in this conventional link 100, each transmission block 102 and reception block 106 must be replaced with optical components and circuitry capable of achieving the desired bandwidths. For high-speed channel bit rates (10 Gb/s and faster), the optical fiber 104 also must often be replaced in order to compensate for signal distortions, which are more prominent at higher data rates. This process can be particularly cumbersome and costly in a long-haul link where hundreds of kilometers of fiber must be replaced. For existing long-haul optical links, the complexity and cost of replacing planted fiber often represents a prohibitive barrier for increasing channel bit rates.

Service providers seeking to optimize revenue and contain cost prefer a highly granular, incremental expansion capability that is cost effective while retaining network scalability. The ability to increase the throughput capacity of single point-to-point links or multi-span links without upgrading or otherwise impacting the remainder of the network is highly desirable from an engineering, administrative and profitability standpoint.

In view of the foregoing, there is a need for a method of increasing a channel data rate in a fiber optics communication link that does not require replacing an existing optical fiber plant or necessitate a change in the expensive optical components. There exists a further need to increase the efficiency of the available spectrum within a given fiber optic communication link and to obtain efficient highly granular bandwidth upgrades without upgrades to an existing optical fiber plant, upgrades to channel combing optics, or significant changes to existing maintenance and administrative procedures. The method should further allow service providers to increase data throughput on a per-link basis as throughput demands increase, generating higher profitability for the service provider and lower cost for the consumer.

SUMMARY OF THE INVENTION

The present invention increases channel data throughput rates without requiring replacement of the existing optical fiber in a link (i.e., the optical fiber plant). In one aspect of the present invention, channel throughput is increased by upgrading the components and circuitry in the head and terminal of an optical fiber communication system link. Advantageously, the present invention can increase aggregate throughput in fiber optic links beyond the limits of conventional WDM upgrades, while eliminating the necessity of replacing existing fiber plants. In addition to providing an alternative to expensive TDM or WDM upgrades, the proposed invention may also be used in tandem with these approaches to achieve even greater increases in data transmission rates. The increase in system throughput is achieved by using advanced modulation techniques to encode greater amounts of data into the transmitted spectrum of a channel, thereby increasing the spectral efficiency of each channel. Representative modulation techniques include $2^n$-ary amplitude shift keying ($2^n$-ASK), $2^n$-ary frequency shift keying ($2^n$-FSK), $2^n$-ary phase shift keying ($2^n$-PSK), as well as combinations of these techniques such as quadrature amplitude modulation (QAM). Because optical fiber has a finite bandwidth, these types of spectrally efficient modulation techniques provide a viable solution for extending channel data rates beyond the limits of standard OOK modulation. The spectral efficiency is improved because all $2^n$-ary variations occupy essentially the same optical bandwidth. Thus a link employing 16-level ASK modulation can have the same spectral occupancy as a 2-level OOK link.

The present invention provides a novel method of increasing transmission capacity by upgrading the head and terminal of the system to achieve greater spectral efficiency and hence throughput. The novel method eliminates the need to replace existing fiber plants. The advanced modulation techniques described above add little or no complexity to the optical components of the channel transmitter and receiver, further reducing the cost of a system upgrade. For $2^n$-ary ASK modulation, which uses $2^n$ different signal levels (amplitudes) to form $2^n$ different transmission symbols, an n-times increase in channel throughput can be provided using the same bandwidth, lasers, modulators, and photo-detectors as those used in the original on-off-keyed (OOK) link. Spectrally efficient complex modulation techniques can be supported by interface circuits having an increased level of signal processing capability in order to both encode multiple bits into a transmitted symbol and decode the original data from the received symbols.

The present invention also provides novel signal processing methods that enhance the transmission of a multilevel optical signal over existing fiber optics communication systems. A novel pre-distortion circuit modifies the transmitted signal based on knowledge of prior data and known link linear and nonlinear performance. A novel linearizer circuit can be used to introduce a nonlinearity into a transmitted signal to precisely counteract any nonlinearities of the optical source. Additionally, a novel forward error correction process is used to enhance the quality of the decoded multilevel signal.

The various aspects of the present invention may be more clearly understood and appreciated from a review of the following detailed description of the disclosed embodiments and by reference to the drawings and claims.

DETAILED DESCRIPTION OF THE EXEMPLARY EMBODIMENTS

Exemplary embodiments of the present invention enable an increase in channel data rates without the replacement of an existing optical fiber plant. Various embodiments of the present invention use a novel multilevel modulation technique to effect a substantial increase in data rate. Advantageously, various embodiments of the present invention enable a substantial data throughput increase in a fiber optics communication system without requiring a modification of the optical fiber plants associated with the system. Specifically, the increase in data rate can be accomplished in various embodiments of the present invention by upgrading head and terminal components, namely, the system transmitters and receivers. The transmitters and receivers can be modified to include advanced $2^n$-ary modulation (demodulation) technology for encoding (decoding) greater amounts of data within the channel spectrum. Representative advanced modulation techniques include multilevel amplitude, frequency and phase shift keying modulations. An exemplary transmitter comprises an n-channel encoder, a digital-to-analog converter (DAC), pre-compensation circuitry, and an optical source. An exemplary receiver comprises an optical detector, distortion post-compensation circuits, an analog-to-digital converter (ADC), and an n-channel decoder.

Figure 2:
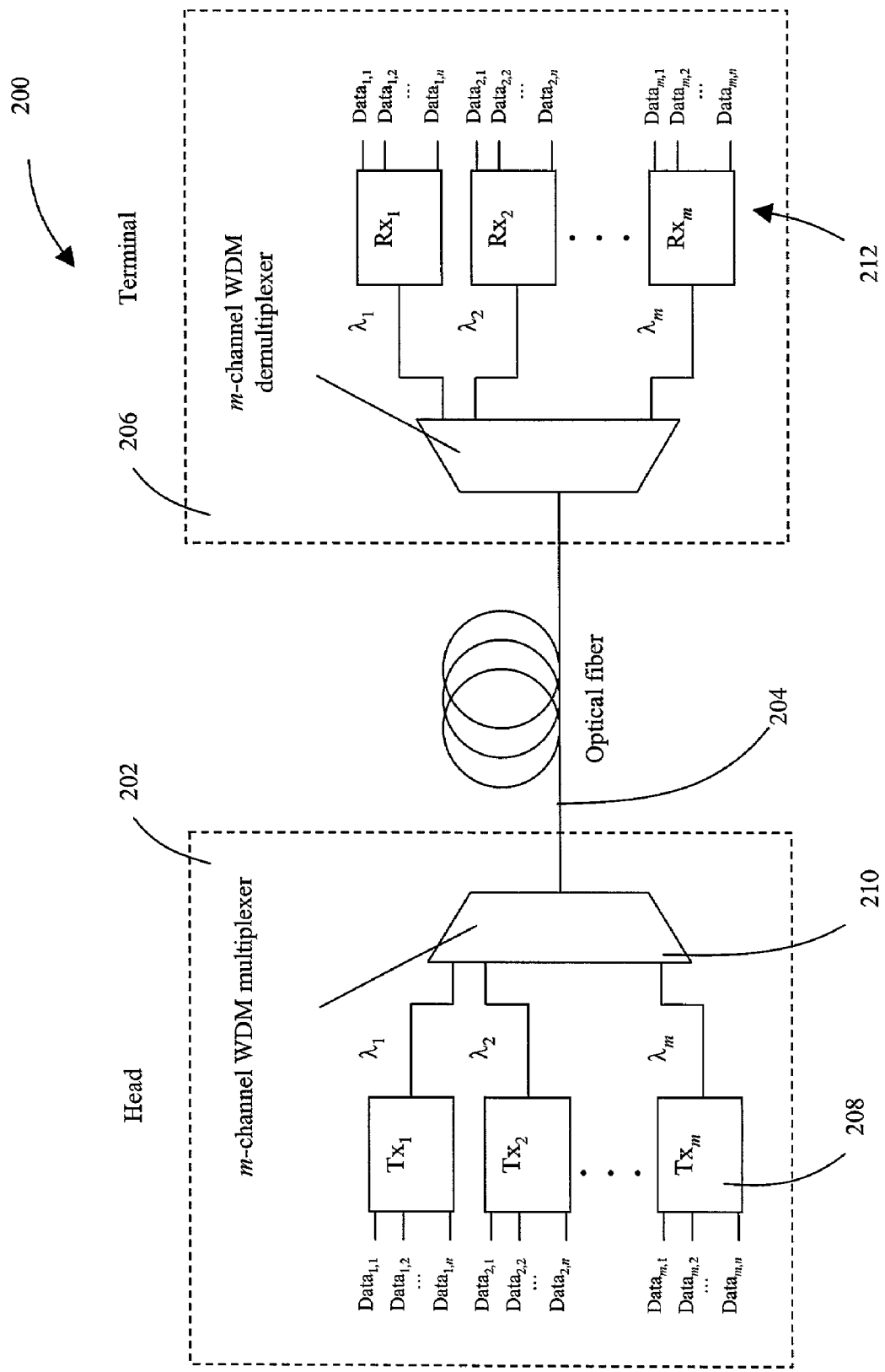
FIG. 2 is a bock diagram of an m-by-n-channel WDM long-haul fiber optic link constructed in accordance with an exemplary embodiment.

FIG. 2 is a block diagram of an m-by-n channel WDM optical transmission system 200 comprising a WDM transmission block (denoted as the "head") 202, the optical fiber 204, and a WDM reception block (denoted as the "terminal") 206. The head 202 comprises m n-channel transmitters (labeled "Tx") 208 and an m-channel WDM multiplexer 210. Each transmitter 208 comprises an optical source and all circuitry necessary to modulate the source with the incoming data stream. For the case of external modulation, the transmitter block also can include a modulator (not shown). The terminal comprises m n-channel receivers (labeled "Rx") and an m-channel WDM demultiplexer. Each receiver typically comprises a photodetector and all circuitry required to operate the detector and to amplify the detected signal in order to output the original electrical data stream.

Figure 1:
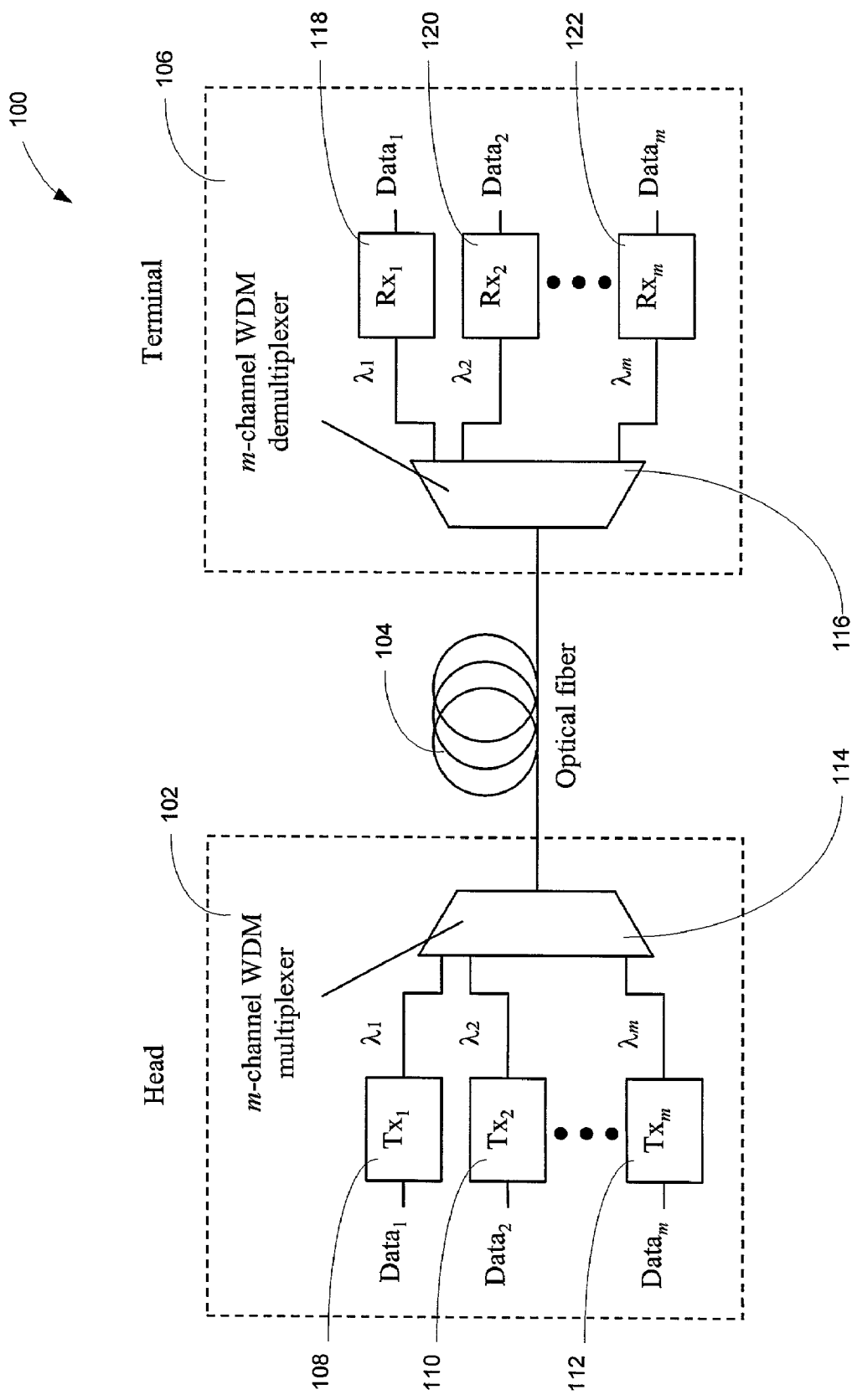
FIG. 1 is a block diagram of a conventional m-channel WDM fiber optic transmission system.

In comparison to the prior art optical transmission system illustrated in FIG. 1, the system of FIG. 2 has been upgraded for increased channel data rates by replacing each transmitter and each receiver of FIG. 1 with multi-level modulation technology transmitters and receivers. Representative advanced modulation techniques include $2^n$-ASK, $2^n$-FSK, $2^n$-PSK, and combinations of these techniques (i.e. $2^n$-QAM). Significantly, the increase in system throughput achieved by the transmission system of FIG. 2 is achieved without replacing the optical fiber network or the interface components connected to the transmitters 208 and to the receivers 212.

The embodiment presented herein provides a method of generating and receiving light to form a spectrally-efficient high-speed ASK optical link. It will be appreciated by one skilled in the art that an FSK signal can be converted into an ASK signal by using a conventional filter, and similarly a PSK signal can be converted into an ASK signal by using a conventional interferometer. QAM modulation is a combination of PSK and ASK and can thus be converted into two ASK data streams. Therefore, the exemplary embodiment addresses the enabling technologies required to process high-speed multilevel signal streams of which ASK is exemplary.

Figure 3:
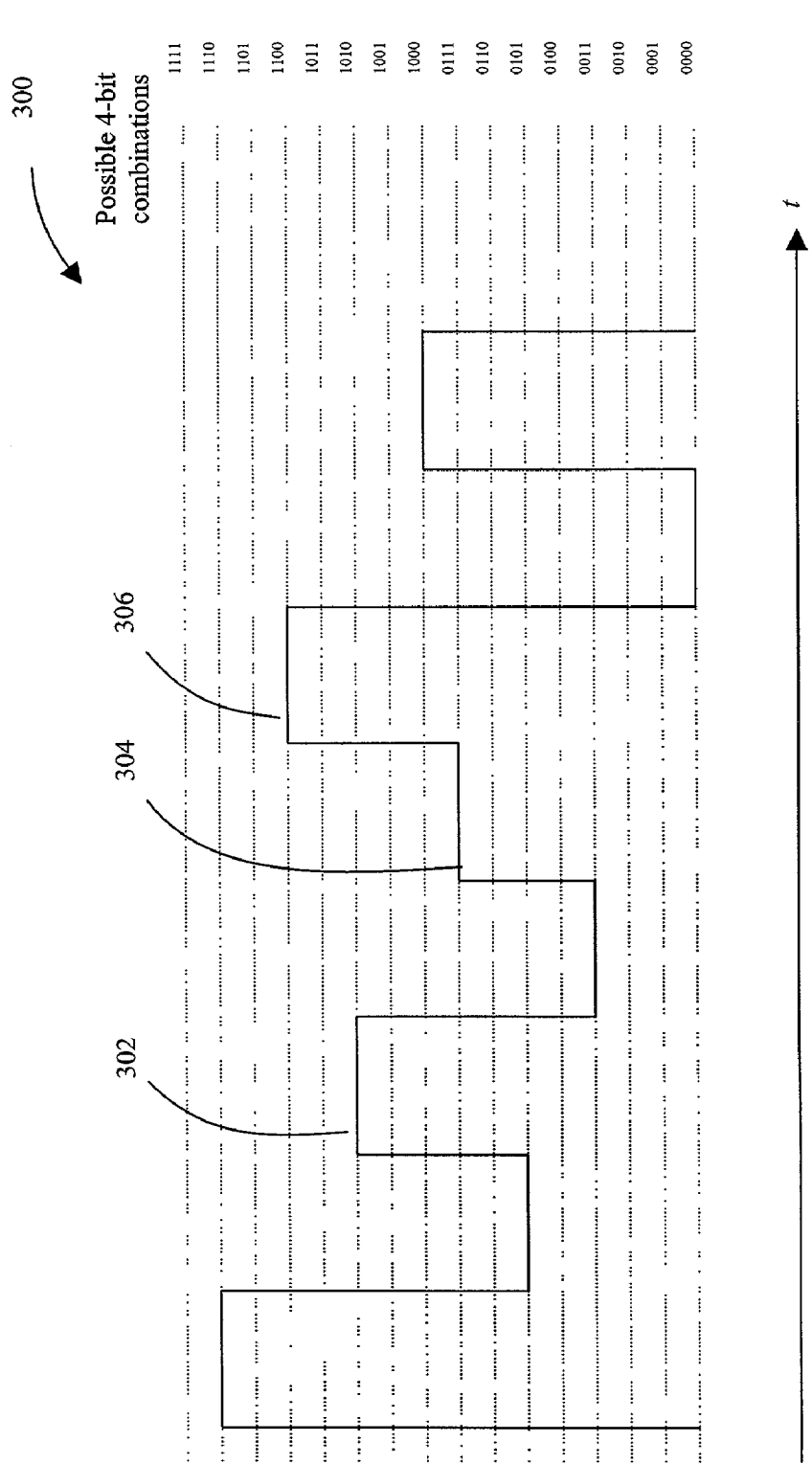
FIG. 3 is a diagram showing a representation example of a 16-level signal, where each symbol represents four independent bits, with one such representation shown to the right.

FIG. 3 depicts an exemplary multilevel ASK signal 300, combining four bits (i.e., 16 possible amplitude levels) into each single transmitted pulse, or symbol. A multilevel signal allows for more than one bit to be transmitted per clock cycle, thereby improving the spectral efficiency of the transmitted signal. For multilevel optical transmission, some characteristic (i.e., signal property) of a transmitted pulse (such as amplitude, phase, etc.) is modulated over $2^n$ levels in order to encode n bits into the single pulse, thereby improving the spectral efficiency of the transmitted pulse. Multilevel modulation can increase aggregate channel throughput by combining n OOK data streams (each with bit rate, B, in bits/s) into one $2^n$-level signal (with a symbol rate, B, in symbols/s) for an aggregate throughput (in bits/s) that is n times greater than B. The aggregate data rate of the signal shown in FIG. 3 is four times greater than a corresponding OOK signal with a bit rate equal to the multilevel symbol rate. As the simplest case, OOK can be regarded as a two level multilevel signal where the symbol rate and bit rate are equal.

As a specific example, the assumption may be made that the 16-level signal in FIG. 3 has a symbol rate of 2.5 Gsym/s. That is, a pulse e.g., 302–306 with one of 16 possible amplitudes is transmitted at a rate of 2.5 Gigapulses/s. Therefore, the aggregate data rate of the 16-level signal is actually 10 Gb/s (4×2.5 Gb/s) because each pulse (i.e., symbols) can represent a distinct value of four bits. The optical components required to transmit and receive a 16-level 2.5 Gsym/s signal are nearly identical to those required for transmitting and receiving an OOK 2.5 Gb/s signal. The components are at least a factor of two times less costly than the components required for an OOK 10 Gb/s signal. In addition, the 2.5 Gsym/s signal, while providing an aggregate throughput of 10 Gb/s, is less susceptible than an OOK 10 Gb/s signal to dispersion limitations in the fiber, minimizing the need for dispersion compensation in the system, and in some cases allowing installed links to operate at higher data rates than possible without multilevel signaling. These factors can significantly reduce system costs while realizing high-speed optical links.

The improved spectral efficiency and reduced system costs afforded by multilevel amplitude modulation are offset to some degree by a corresponding degradation in the signal-to-noise ratio (SNR) of the signal due to the reduced energy separation between signals. For example, modeling channel distortions as additive, white Gaussian noise (independent of the transmitted signal), the received power penalty necessary to achieve the same error performance for a multilevel ASK signal compared to an OOK signal with equal symbol rate is described by the equation:

$$\Delta P = -10\log(2^n-1)$$

where $\Delta P$ is the penalty (in dB) and $2^n$ is the number of levels. This penalty compares the proposed approach using a data rate n times faster than the baseline OOK modulation. One can also compare the two methods using the same data rate. The power penalty for this case is:

$$\Delta P' = -10\log([2^n-1]/\sqrt{n}).$$

The penalty is lower for this constant data rate comparison because the reduced bandwidth for the proposed multilevel scheme allows for higher out-of-band noise suppression. The penalty ΔP' does not take into account the effects of dispersion. These effects are negligible at data rates on the order of 2.5 Gb/s but can be quite significant at data rates 10 Gb/s and higher. Thus, the penalty ΔP' is overstating the penalty associated with multilevel signaling because the signal model for the high rate OOK scheme neglects the significant effects of dispersion.

Figure 4:
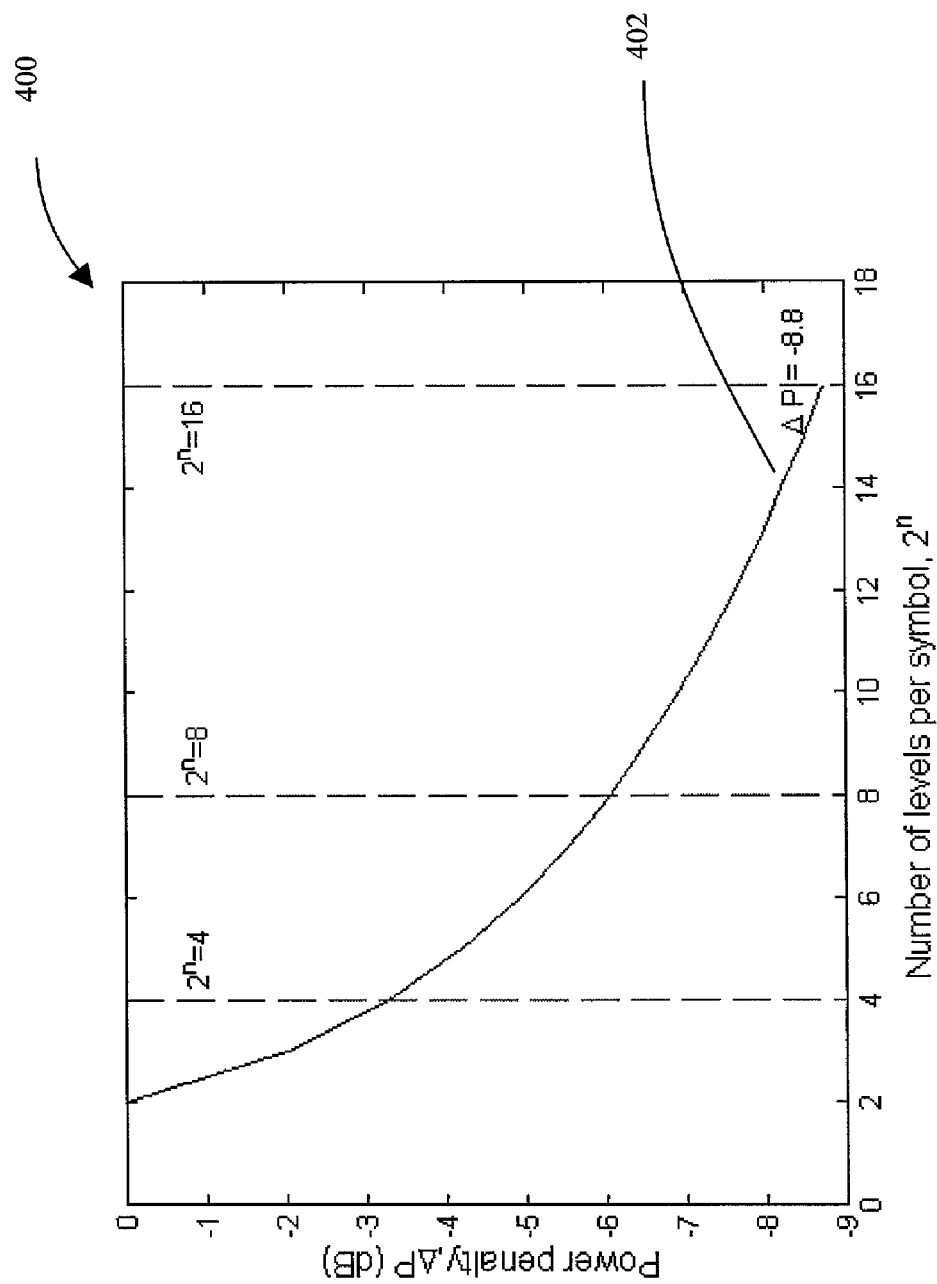
FIG. 4 is a graph illustrating the optical power penalty as a function of normalized data rate for a multilevel ASK signal as compared to an equivalent data rate OOK signal.

FIG. 4 is a graph 400 depicting a curve 402 representing an exemplary optical power penalty for OOK and multilevel signals as a function of normalized aggregate data rate. The plot displays the increase in signal power required for multilevel signaling to achieve the same error rate as OOK signaling operating at the same data rate. If the power penalty associated with multilevel optical transmission can be overcome with signal processing gains, this method of data transmission can be a viable, cost effective solution for realizing high-speed fiber optic links. Various embodiments of the present invention are described below and address methods of overcoming this optical power penalty.

An Exemplary Transmitter

Figure 5:
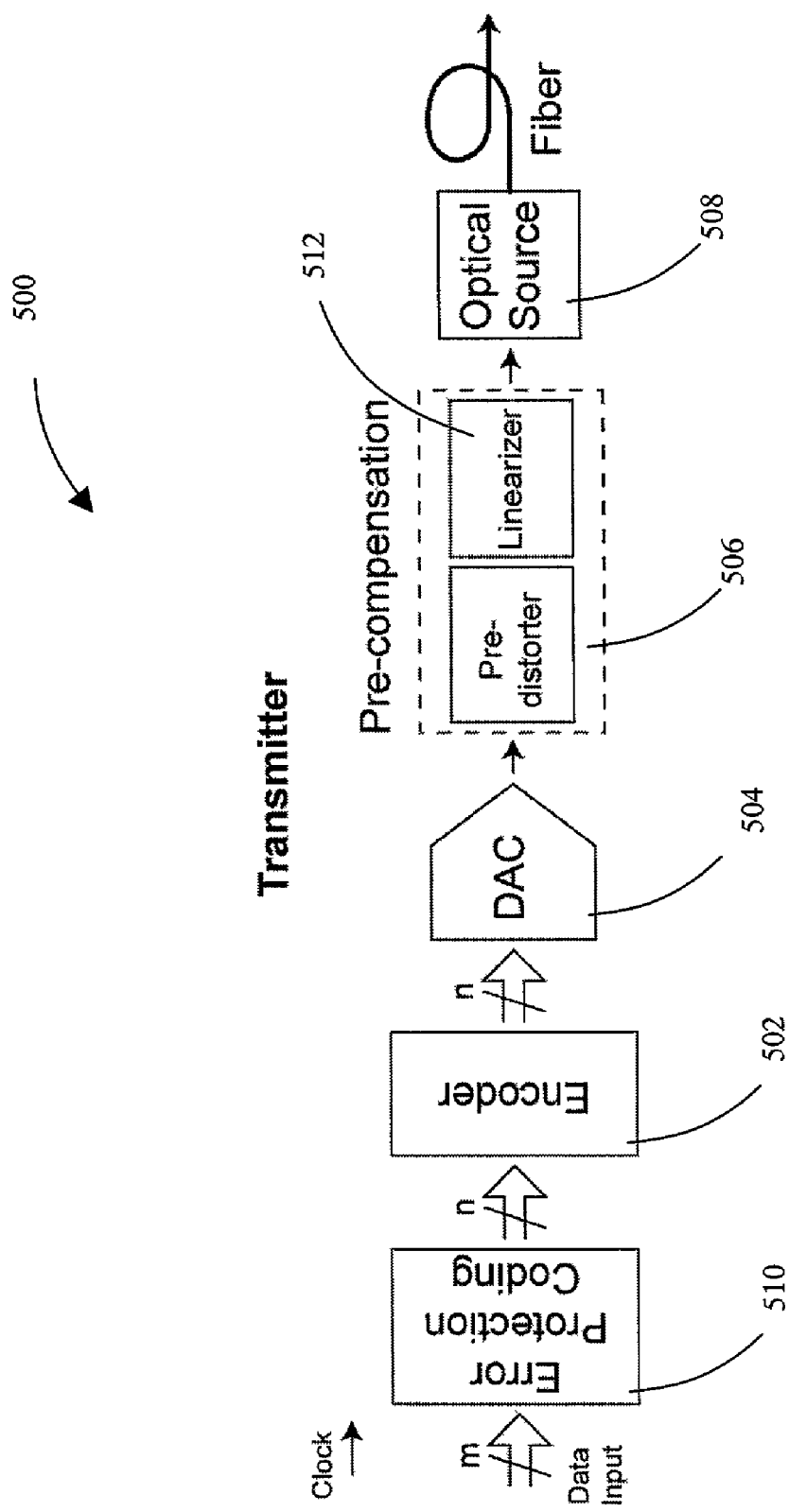
FIG. 5 is a block diagram of an exemplary transmitter.

FIG. 5 is a block diagram depicting multilevel ASK optical transmitter 500 that is an exemplary embodiment of the present invention. The transmitter 500 typically comprises an error protection coding (EPC) module 510, an n-channel encoder 502, a Digital to Analog Converter DAC 504, pre-compensation circuitry 506, and an optical source 508. The combination of the error protection coding (EPC) module 510, n-channel encoder 502, Digital to Analog Converter DAC 504, and pre-compensation circuitry 506 may be referred to as a symbolizer. The electronics of the transmitter 500 are termed the "symbolizer", since they generate the $2^n$ distinct symbols from one or more binary data input streams. The EPC module 510 maps an m-bit word (that consists of a single bit from each of the m input data streams) into an n-bit word where n≧m. The data is processed by this module so that when decoded in the receiver, the protected word is robust to bit errors introduced by the encoding/transmission/decoding process.

For every clock cycle, the encoder 502 converts the protected n-bit word into a second "error-resistant" n-bit word. Gray codes, such as the Q-Gray code shown in Table 1, are an example of "error-resistant" codes, where Q-Gray codes are defined to be a class of Gray codes satisfying the property that the maximum number of transitions on each bit is minimized as one cycles through the sequence. This limitation on the maximum number of transitions produces codes that surpass tradition Gray-codes in that the impact of errors in excess of adjacent levels is minimized. For example, the Q-Gray code in Table 1 has a maximum of four transitions (which is the minimum value possible) on any bit as one cycles through the sequence. The traditional reflected Gray code, however, has eight transitions on the least significant bit and thus does not meet our definition of a Q-Gray code. It should be obvious to one skilled in the art, that a set of equivalent Q-Gray codes that can be formed from the one tabulated in Table 1. The bit columns can be arbitrarily rearranged, the columns can be inverted, and the code can be "rotated" in 16 different ways, resulting in a total of 6144 equivalent codes that we term "Q-Gray codes". The encoded n-channels are input to the DAC 504, which generates a $2^n$-level electrical signal that can be used to modulate the optical source 508. The optical source 508 could in practice be a directly modulated laser or a laser with an external modulator and can transmit distinct data values (symbols) by transmitting varying levels of optical intensity over an optical communication medium, such as an optical fiber.

TABLE 1

Binary encoding schemes for 16 level transmission.

| Transmitted Level | Conventional Binary | Reflected Binary (Gray code) | Q-Gray Code |
|---|---|---|---|
| 15 | 1111 | 1000 | 1000 |
| 14 | 1110 | 1001 | 1010 |
| 13 | 1101 | 1011 | 1110 |
| 12 | 1100 | 1010 | 1100 |
| 11 | 1011 | 1110 | 0100 |
| 10 | 1010 | 1111 | 0101 |
| 9 | 1001 | 1101 | 1101 |
| 8 | 1000 | 1100 | 1001 |
| 7 | 0111 | 0100 | 1011 |
| 6 | 0110 | 0101 | 1111 |
| 5 | 0101 | 0111 | 0111 |
| 4 | 0100 | 0110 | 0110 |
| 3 | 0011 | 0010 | 0010 |
| 2 | 0010 | 0011 | 0011 |
| 1 | 0001 | 0001 | 0001 |
| 0 | 0000 | 0000 | 0000 |

In an exemplary embodiment of the present invention, four digital channels can be input to the EPC module 510. The EPC module 510 makes the data more robust by sending an extra n−m bits of data for every m input bits. These redundant error correction (EC) bits allow for the correction by the receiver of bit errors incurred during the encoding/transmission/decoding process. One skilled in the art will recognize that a variety of existing algorithms may be used to accomplish this. Typical algorithms included Reed-Solomon codes, Reed-Muller codes, block codes, convolutional codes, and trellis codes to name a few. The additional data introduced by the EPC module may be addressed either by increasing the system clock rate or by using more than four channels throughout the remainder of the system. Both addresses are transparent to the proposed invention as they simply correspond to a change in an operational parameter. In particular, increasing the clock rate involves sending pulses with a shorter duration, and using more channels involves using a larger value for n. Thus, no generality is lost in assuming that the clock rate is increased and number of data channels is kept at four for the purpose of describing the invention.

The EPC module 510 feeds the processed data into the encoder 502. The four encoded channel can then be input to the DAC 504 and converted to one of 16 possible amplitude levels for a four times increase in data throughput. The encoding function of the four-channel encoder 502 as well as the corresponding DAC output is summarized in Table 2.

TABLE 2

Q-Gray encoding and DAC output.

| Input Four-Bit Word | Q-Encoded Four-Bit Word | Level Output by DAC |
|---|---|---|
| 1111 | 1000 | 8 |
| 1110 | 1010 | 10 |
| 1101 | 1110 | 14 |
| 1100 | 1100 | 12 |
| 1011 | 0100 | 4 |
| 1010 | 0101 | 5 |
| 1001 | 1101 | 13 |
| 1000 | 1001 | 9 |
| 0111 | 1011 | 11 |
| 0110 | 1111 | 15 |

TABLE 2-continued

Q-Gray encoding and DAC output.

| Input Four-Bit Word | Q-Encoded Four-Bit Word | Level Output by DAC |
| --- | --- | --- |
| 0101 | 0111 | 7 |
| 0100 | 0110 | 6 |
| 0011 | 0010 | 2 |
| 0010 | 0011 | 3 |
| 0001 | 0001 | 1 |
| 0000 | 0000 | 0 |

Pre-distortion of the transmitted data can help compensate for non-ideal link frequency response and for some classes of link non-linearities, effectively reducing pattern-dependent errors in the transmitted data. Hence, this technique is often referred to as pre-compensation. This pre-distortion (as described below) may operate at the analog/symbol level as shown in FIG. 5 or on the digital level as shown in the transmitter 600 of FIG. 6. Either method can be algorithmically identical and selected based on the cost of implementation. An exemplary linearization circuit block 512, 602 is shown in both FIG. 5 and FIG. 6. These circuits can linearize the optical source, which is expected to be the most nonlinear element in the optical link. The functional blocks, less the optical source shown in FIGS. 5 and 6, can be integrated into one circuit or multichip module.

A number of coding options exist to accomplish the desired EC necessary to compensate for the power penalty associated with multilevel amplitude modulation. The EPC 510 will be responsible for implementing such algorithms. An exception to this is the implementation of Gray codes (as described in U.S. Pat. No. 2,632,058), which are an example of block coding with m=n. The Gray code can be implemented in the encoder since it corresponds to a one-to-one mapping, which can be implemented with a small logic circuit. In the '058 patent referenced above, a method of encoding binary notation is described such that adjacent words in the code are differentiated by a change in only one bit. This method can be distinguished from conventional binary notation where adjacent words often differ by several bits. For example, the binary equivalent of 7 in a four-bit word is 0111. The binary equivalent of 8 (an adjacent "word" to 7) is 1000; each of the four bits is reversed. Although the teaching in the '058 patent pertains to pulse code modulation, the same principles can be applied to multilevel amplitude modulation. If conventional binary notation is used to encode four data streams into a single 16-level stream, the bit error rate (BER) of the channels will be especially sensitive to those transitions between adjacent levels that involve a change of greater than one bit. Thus, Gray codes can reduce bit error rates (without the addition of redundant EC bits) in systems where the channel rate is increased using multilevel encoding. As stated above, Table 1 relates a conventional binary encoding for a 16-level (four channels) transmission to various Gray code encoding schemes. Each of the digits in the four-bit words shown in the table represents a transmitted bit from one of the four independent data streams. The binary reflected notation is described in the '058 patent. The alternative Gray code (which we will denote as Q-Gray code for simplicity) is presented in the table as an alternative embodiment of the Gray code implementation for multilevel amplitude modulation. In addition to the adjacent levels differing by only one bit, the alternative code can further enhance channel BERs because, for each individual channel, several adjacent levels do not effect a change in the transmitted bit value for that channel.

Figure 6:
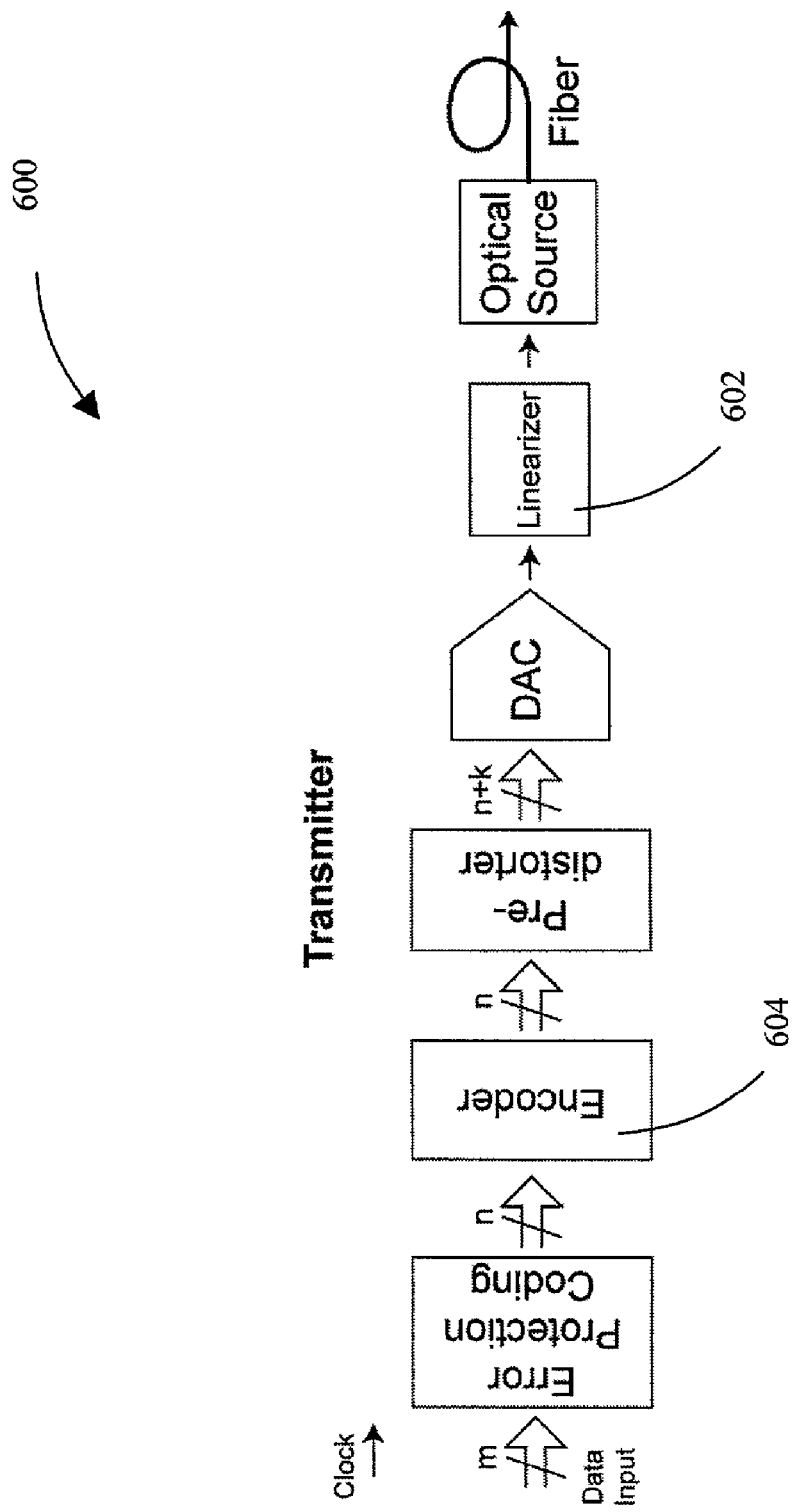
FIG. 6 is a block diagram of an alternative exemplary transmitter.
Figure 7:
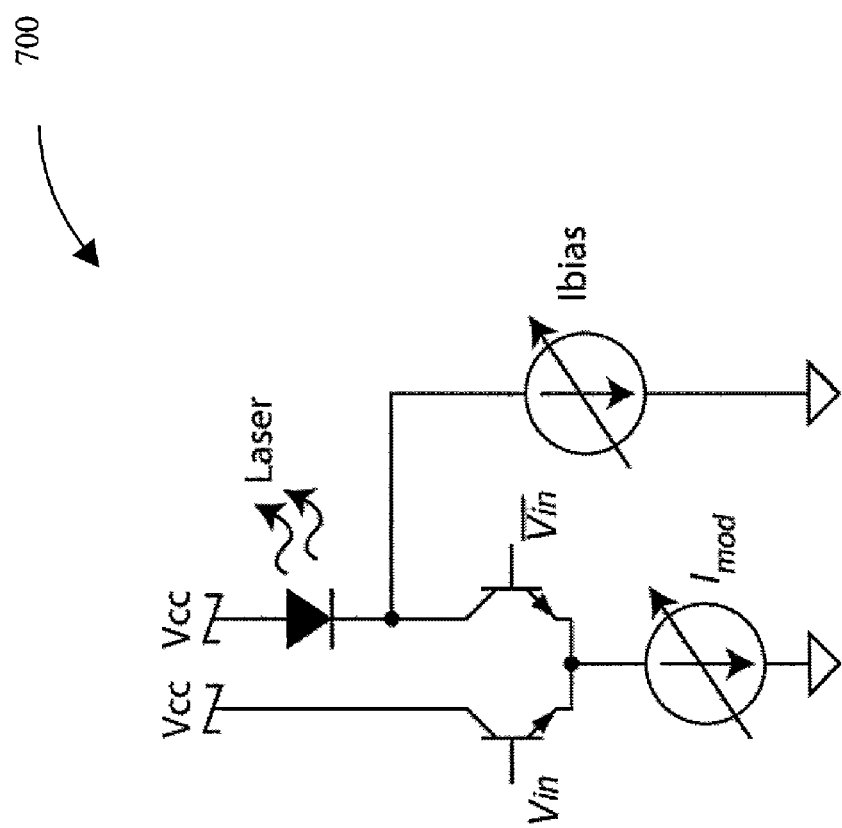
FIG. 7 is a circuit diagram of a traditional laser driver.
Figure 8:
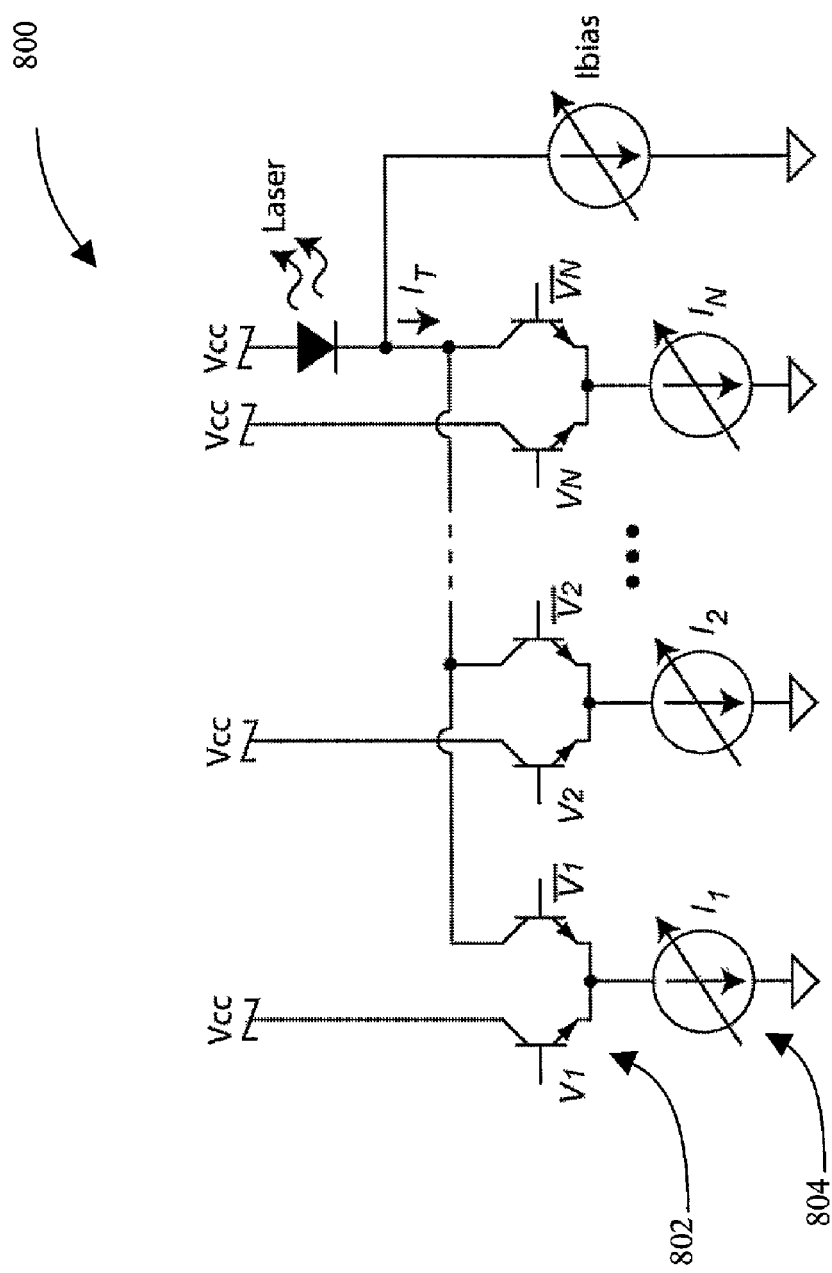
FIG. 8 is a circuit diagram of an exemplary multilevel laser driver.

The encoders (502, 603) depicted in FIG. 5 and FIG. 6 can perform, among other things, the encoding function described in Table 2. Those skilled in the art will understand that various combinational logic circuits can be designed to perform an encoding function. FIG. 8 is a block diagram depicting an exemplary embodiment of a DAC 800, which can best be used to directly drive a laser diode. The circuit of FIG. 8 is similar to the conventional laser driver circuit 800 of FIG. 7 with the exception that the differential switch transistors (e.g., 802) and modulation current source (e.g. 804) are divided up into N appropriately binary-divided parts. In this manner, the multilevel driver 800 is anticipated to exhibit very similar speed properties as a conventional driver 700.

During circuit operation, the individual N bits ($A_i$) of a binary encoded binary word, A, are individually applied to the respective differential switch inputs (e.g., 806). A binary word is assumed to be made up of N bits ($A_N, A_{N-1}, \ldots A_2, A_1$) of value 0 to 1, and the decimal value, $D_w$, of the word is shown in Equation 1:

$$D_W = A_N \cdot 2^{N-1} + A_{N-1} \cdot 2^{N-2} + \ldots + A_2 \cdot 2 + A_1 = \sum_{i=1}^{N} A_i \cdot 2^{i-1} \quad (1)$$

This is the conventional definition of a binary encoded word. The corresponding differential inputs for each ith binary bit, $A_i$, are labeled $V_i$ and $V_i'$ to represent the fact that the actual voltages used to represent the binary levels are not 0 and 1. Nevertheless, it is assumed that the differential switch is driven appropriately for one of each of the switches' transistors to be "on" for any given logic state.

The current sources $I_1$ through $I_N$ are binary weighted as follows in Equation 2:

$$I_i = \frac{I_{mod}}{2^N - 1} \cdot 2^{i-1}, \quad (2)$$

where $I_{mod}$ is the modulation current of the traditional laser driver circuit. The N individual bits of the applied binary word drive the respective switch that controls the current source determined in Equation (2). This results in a total current, $I_T$, of Equation 3:

$$I_T = \sum_{i=1}^{N} A_i \cdot I_i = \sum_{i=1}^{N} A_i \cdot \frac{I_{mod}}{2^N - 1} \cdot 2^{i-1} \quad (3)$$

Grouping the constant terms in Equation (3) gives the definition of total current shown in Equation 4:

$$I_T = K \cdot \sum_{i=1}^{N} A_i \cdot 2^{i-1} \quad (4)$$

in which the constant K is defined in Equation 5:

$$K = \frac{I_{mod}}{2^N - 1} \quad (5)$$

Comparing Equation (4) to Equation (1) shows that the resulting total output current, $I_T$, is a perfect analog representation of the decimal value of the binary word. This circuit 800 effectively forms a large-current digital-to-analog converter.

The speed of the multilevel driver 800 can be similar to the speed of the conventional driver 700 if the differential switches 802 and current sources 804 are appropriately scaled for device size. The size of the transistors 802 used for the circuit 800 directly impacts circuit speed. In general, the smaller the transistors used to perform a circuit's function, the faster the circuit. For the i current paths of the modulator, the current level through each path is proportional to $2^{i-1}$. Therefore the transistor sizes, $S_i$, of both the differential switch 802 and current sources 804 can be scaled by as shown in Equation 6:

$$S_i = \frac{S_o}{2^N - 1} \cdot 2^{i-1}, \quad (6)$$

where $S_o$ is the size of the conventional laser drivers transistors (FET width or BJT area). With this device scaling, the total device size of all current paths, which is a good indicator of circuit speed is defined in Equation 7:

$$S_T = \sum_{i=1}^{N} S_i = \frac{S_o}{2^N - 1} \sum_{i=1}^{N} 2^{i-1} \equiv S_o \quad (7)$$

The total device "size" of all current paths is identical to the conventional driver circuit 700 and therefore should exhibit a very similar circuit speed.

Figure 9:
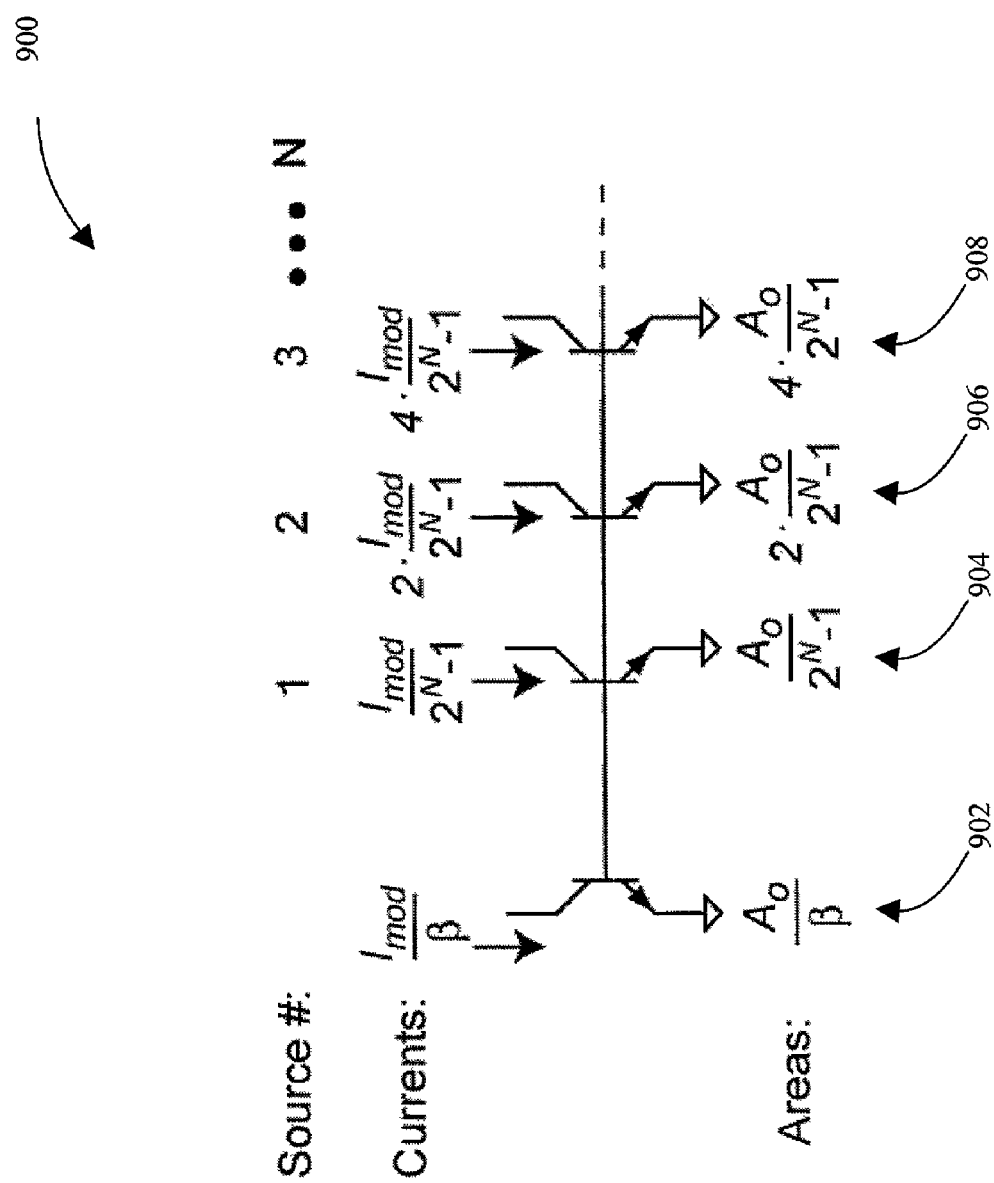
FIG. 9 is a schematic diagram of an exemplary adjustable binary-weighted multi-output current source.

The plurality of current sources 804 shown in FIG. 8 can be conveniently realized by using scaled current mirrors as shown in FIG. 9. In this circuit 900, the BJT area is scaled to provide precise current scaling. A current injected into the reference BJT 902 will be "mirrored" as per area ratios to the multiple BJT current source outputs 904–908. The injected current on the reference BJT 902 sets the current range for the circuit 900. The actual input current used to control the plurality of sources can be scaled as desired as shown by a scaling factor β. If FET devices are used to realize this circuit, the FET widths can be similarly scaled.

This circuit 900 is a high-output-current digital-to-analog converter, which can be applied to a variety of applications including the driving of laser diodes. In particular, if the laser diode shown in FIG. 8 was replaced with a load resistor, the binary controlled current will be converted to a voltage allowing for the drive of other voltage-controlled optical modulators (e.g., the Mach-Zehnder modulator). This exemplary DAC 900 can be used to directly drive an optical source or drive other pre-compensation networks, which subsequently drive the optical source.

The pre-compensation blocks shown in FIG. 5 and FIG. 6 will appropriately modify the transmitted signal to produce a faithful output at the receiver. An exemplary pre-compensation block 506 comprises a pre-distortion circuit 511 and a linearizer 512. The pre-distortion circuit 511 can modify the transmitted signal based on knowledge of prior data and known link linear and nonlinear performance. The linearizer circuit 512 can present a nonlinearity, which ideally exactly counteracts the nonlinearities of the optical source. Furthermore, the pre-compensation block, which operates at a particular symbol rate, also enables the simultaneous optimization of the transmitted phase when the information is contained in the symbol amplitude. Thus, well known modulation techniques, such as duobinary, can be readily combined with the pre-compensation function.

Figure 10:
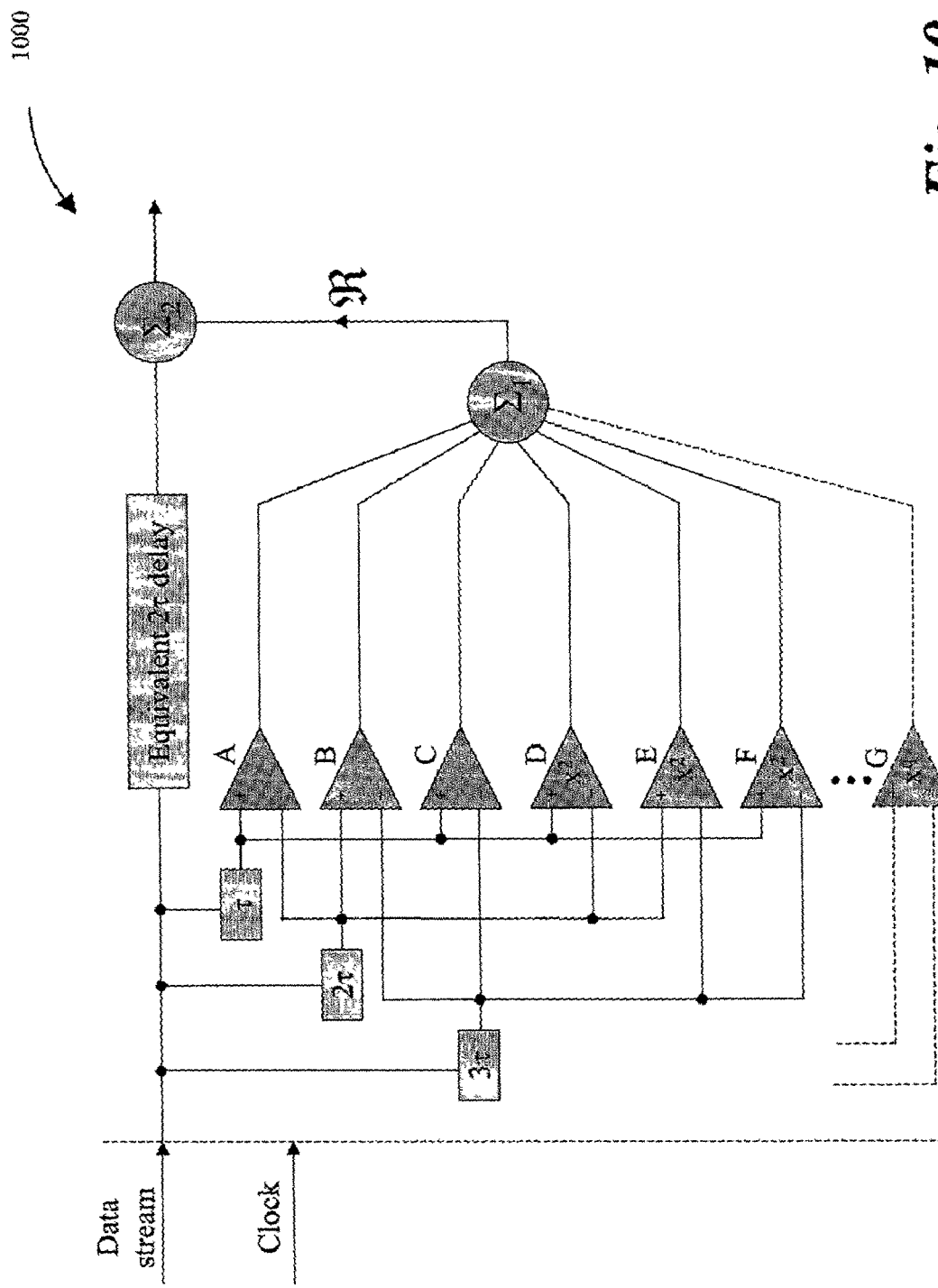
FIG. 10 is a circuit diagram of an exemplary pre-distortion compensation circuit.
Figure 11:
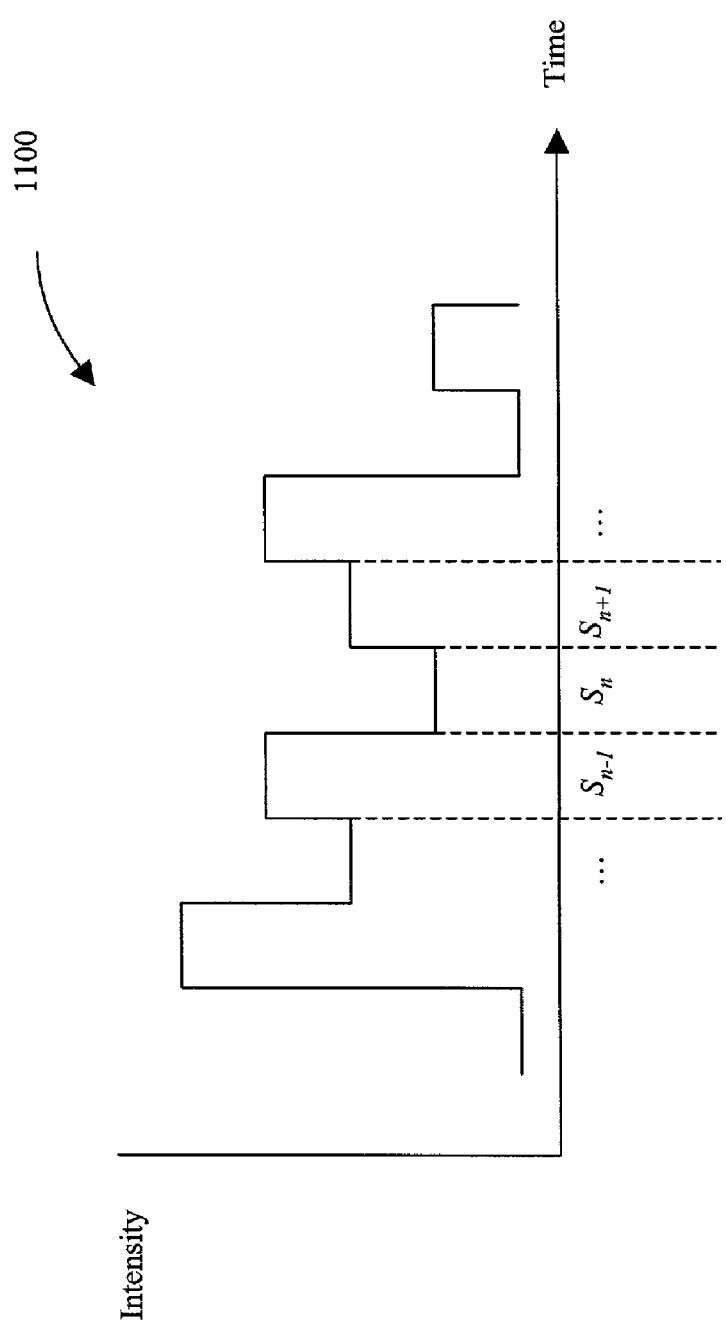
FIG. 11 is a diagram illustrating an example of a multilevel data stream.

FIG. 10 is a block diagram depicting an exemplary embodiment of a pre-distortion channel compensator 1000 for the multilevel transmitter 500 shown in FIG. 5. In this embodiment, the amplitude of the symbol to be transmitted can be modified based on the amplitudes of preceding and succeeding symbols to ensure that the receiver and decoder are able to accurately detect the proper symbol amplitude after transmission. The incoming electrical multilevel data stream is tapped (i.e., interrogated) and subsequently delayed with three separate delays so that all three signals can be analyzed. As an example, each delay may consist of a transmission line. The delay associated with each tap (τ, 2τ, and 3τ) is shown in FIG. 10 with τ=1/(symbol rate). Thus each tapped delay line isolates one of a set of adjacent symbols to be transmitted. Specifically, the 2τ tap, for a given clock cycle, represents the multilevel symbol to be transmitted during that clock cycle, while for the same clock cycle, the τ and 3τ taps represent the succeeding and preceding symbols in the data stream, respectively. This concept is illustrated in FIG. 11, where in a multilevel amplitude modulated signal 1100 is depicted. $S_n$ represents the symbol to be transmitted, and $S_{n+1}$ and $S_{n-1}$ represent the succeeding and preceding symbols in the data stream.

Returning to FIG. 10, each of the differential amplifiers A, B, and C linearly amplifies the difference between two of the tapped symbols. The function of each of these amplifiers is represented by the Equations 8–10 below:

$$G_A(S_{n+1}-S_n) = A \cdot (S_{n+1}-S_n) \quad (8)$$

$$G_B(S_n-S_{n-1}) = B \cdot (S_n-S_{n-1}) \quad (9)$$

$$G_C(S_{n+1}-S_{n-1}) = C \cdot (S_{n+1}-S_{n-1}) \quad (10)$$

where $G_k$ is the gain of the amplifier (with k=A, B, or C).

The differential amplifiers D, E, and F are second order amplifiers and operate by amplifying the square of the difference between two of the tapped symbols. The function of each of these amplifiers is described by Equations 11–13:

$$G_D(S_{n+1}-S_n) = D \cdot (S_{n+1}-S_n)^2 \quad (11)$$

$$G_E(S_{n+1}-S_n) = E \cdot (S_{n+1}-S_n)^2 \quad (12)$$

$$G_F(S_{n+1}-S_n) = F \cdot (S_{n+1}-S_n)^2 \quad (13)$$

The differential amplifier G shown in FIG. 10 indicates that higher order functionality is easily included in this signal-processing filter. Any two of the tapped symbols can be input to the amplifier such that amplification of order q>2 is performed on the difference between the symbols. The specific inputs are not specified in the figure to indicate that any of the symbols may be input to the amplifier. It should be clear to one skilled in the art that this design lends itself to the inclusion of additional higher-order (i.e., q>2) differential amplifiers (H, I, J, etc.), which are not explicitly shown in the figure.

The element $\Sigma_1$ sums the output symbols from the differential amplifiers A through G, generating the polynomial $\Re$ shown in Equation 14:

$$\Re = A \cdot (S_{n+1}-S_n) + B \cdot (S_n-S_{n-1}) + C \cdot (S_{n+1}-S_{n-1}) + D \cdot (S_{n+1}-S_n)^2 + E \cdot (S_n-S_{n-1})^2 + F \cdot (S_{n+1}-S_{n-1})^2 + G \cdot (\ldots)^q \quad (14)$$

As an example, $\Sigma_1$ may be an adder or a power combiner.

The element $\Sigma_2$ (which, as an example, may be an adder or a power combiner) sums $\Re$ with the symbol to be transmitted ($S_n$) in the data stream. For this reason, the data stream must be delayed by an amount equivalent to the delay applied to the tapped $S_n$ symbol. For the case shown in FIG. 10, the necessary delay would be $2\tau$. In addition, the clock signal used in conjunction with a timing recovery circuit may be required at $\Sigma_2$ in order to ensure proper synchronization of the data stream with $\Re$. Thus, the circuit 1000 shown in FIG. 10 will transmit the symbol $S'_n = \Re + S_n$ for each symbol in the data stream. In this way, the symbol $S_n$ is predistorted by the amount $\Re$ to ensure that $S_n$ is accurately received after transmission.

FIG. 10 depicts an exemplary embodiment of a generalized precompensation technique. This technique may include, for example, corrections that are proportioned to the difference between the preceding and succeeding symbols, identified with the coefficient C in FIG. 10. It will be appreciated by those skilled in the art that higher order corrections are possible. As long as the channel distortions are "well-behaved," the number of correction terms in $\Re$ will be limited and the circuit implementation simplified.

Those skilled in the art will appreciate that the method of precompensation described above also may be implemented with a pre-determined, stored digital mapping function or lookup table. In such a case, the appropriate modification to the transmitted output symbol, as determined by the lookup table, may be based on characteristics of the symbol itself as well as those of one or more preceding and succeeding output symbols. For example, a 16 level system (n=4) which interrogates 3 input symbols, (i.e., the symbol to be transmitted and the preceding and succeeding pulse) requires 4096 table entries. For high symbol rates (e.g., 2.5 Gsym/s and greater), the implementation of a large lookup table can become increasingly complex. Hence, the previously described analog circuit embodiment, which is designed to approximate the functionality of a lookup table, may be preferred. In either case, the lookup table entries or the coefficients of the circuit implementation may be dynamically updated to maintain the desired system performance.

Figure 12:
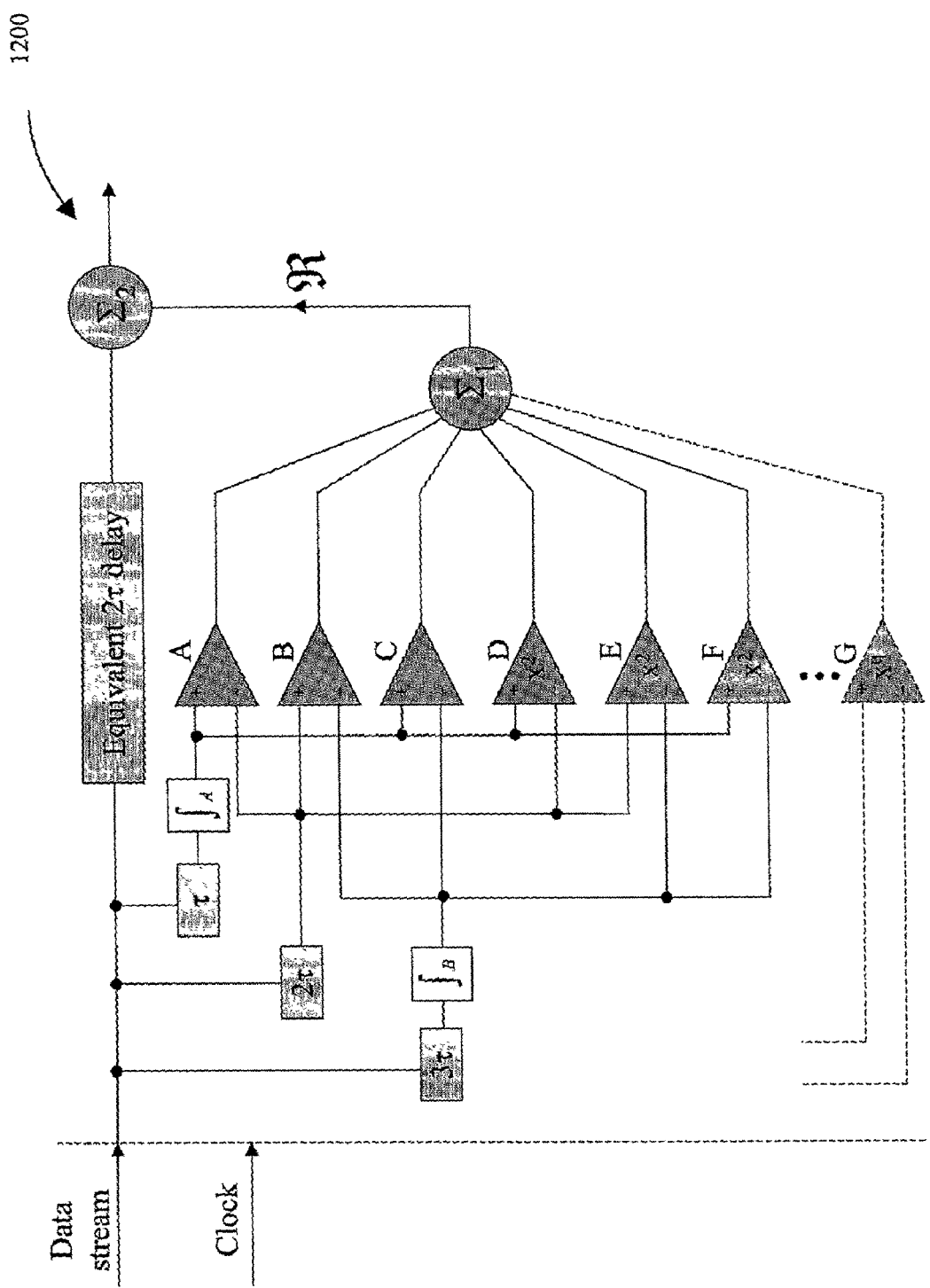
FIG. 12 is an illustration of an exemplary precompensation circuit.

FIG. 12 is a block diagram depicting an alternative embodiment of the precompensation filter 1200. While similar in operation to the exemplary embodiment depicted in FIG. 10, this exemplary embodiment has integrator circuits A 1202 and B 1204 integrated with the delay lines corresponding to the preceding and succeeding symbols in the data stream. These integrator circuits 1202, 1204 have time constants that are equal to some value slightly larger than the inverse of the symbol rate. Thus, the integrations performed by the circuits act over a period greater than one symbol length, effectively extending the set of symbols used to determine $\Re$ to include information regarding symbols just beyond the boundary of the set. For example, the precompensation factor for the embodiment shown in FIG. 12 can be expressed as shown in Equation 15:

$$\Re = A \cdot (\int S_{n+1} dt - S_n) + B \cdot (S_n - \int S_{n-1} dt) + C \cdot (\int S_{n+1} dt - \int S_{n-1} dt) + D \cdot (\int S_{n+1} dt - S_n)^2 + E \cdot (S_n - \int S_{n-1} dt)^2 + F \cdot (\int S_{n+1} dt - \int S_{n-1} dt)^2 + G \cdot (\ldots)^q \quad (15)$$

The limits of integration in the above expression can be set to some interval of time greater than the inverse of the symbol rate. In this way, the integration path is extended beyond the bit length of the symbol in the integrand in order to include information regarding neighboring symbols in the data stream. Thus, the expression above, in reference to FIG. 12 now takes into account information regarding the symbols $S_{n+2}$ and $S_{n-2}$, which are beyond the set of symbols $\{S_{n-1}, S_n, S_{n+1}\}$. The integrated symbols along with the symbol $S_n$ can be amplified (as before) by linear and higher order amplifiers. As in the previous case, synchronization of the data stream and $\Re$ may be required at $\Sigma_2$.

Figure 13:
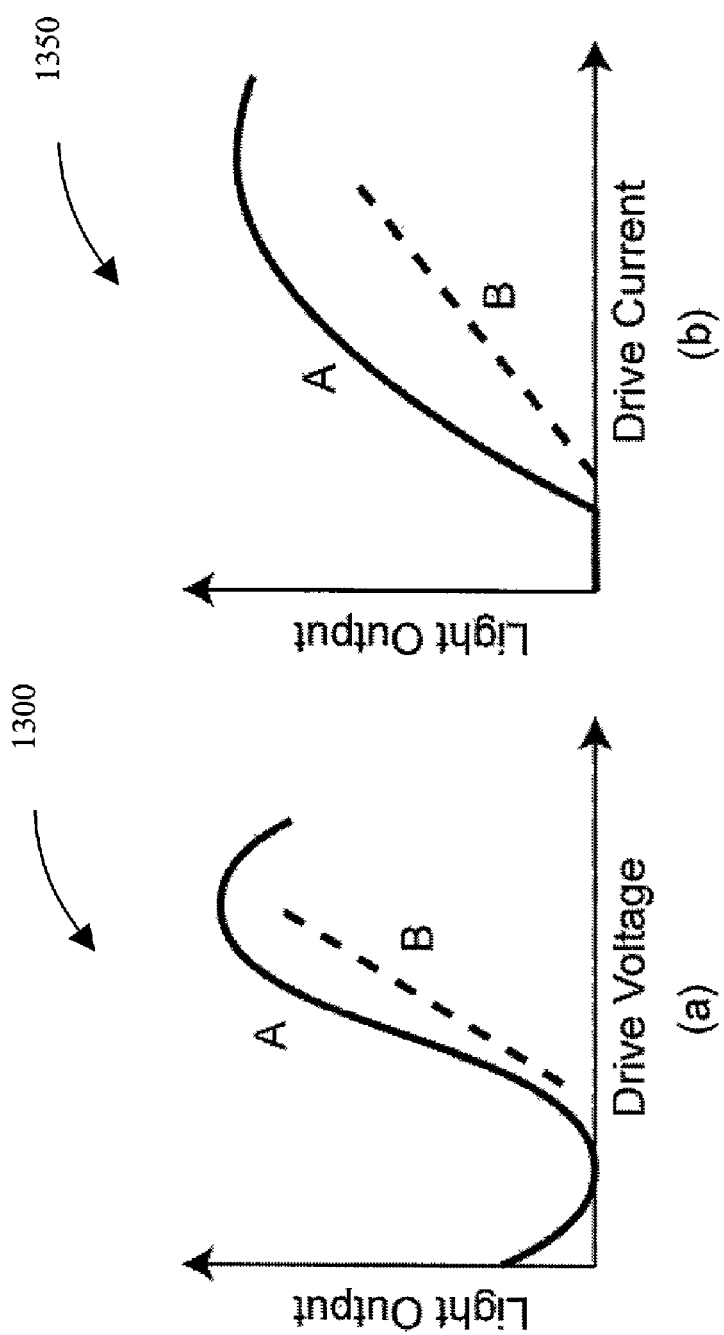
FIGS. 13 (a) and (b) are diagrams of the typical nonlinearities of (a) Mach-Zehnder modulators and (b) directly modulated laser diodes.

FIG. 13 is a pair of graphs 1300, 1350 depicting typical light output versus input current of a laser diode, and control voltage of an M-Z modulator. Both device classes suffer from a random offset (i.e. termed the threshold current on a laser), which can be handled by a simple offset current or voltage by the driver circuit. The objective here is to linearize these transfer curves like the linear ones labeled as "B" in each graph.

Figure 14:
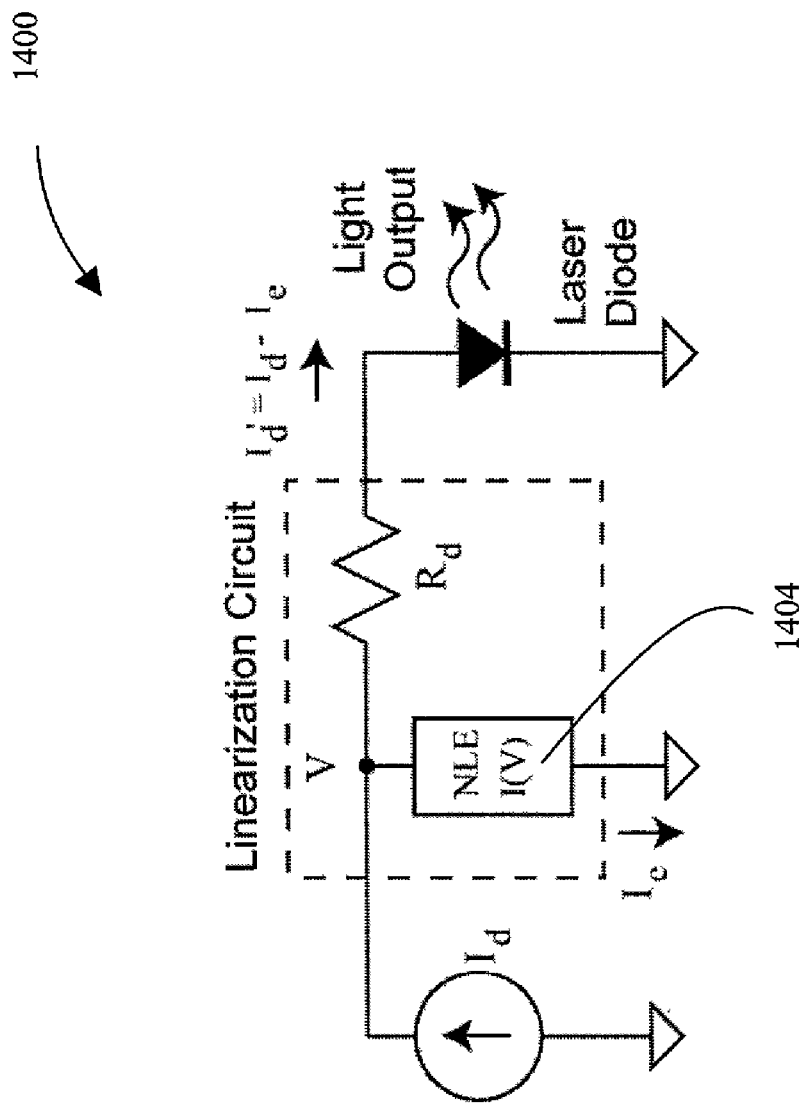
FIG. 14 is a circuit diagram of an exemplary linearization network applied to a directly modulated laser diode.
Figure 15:
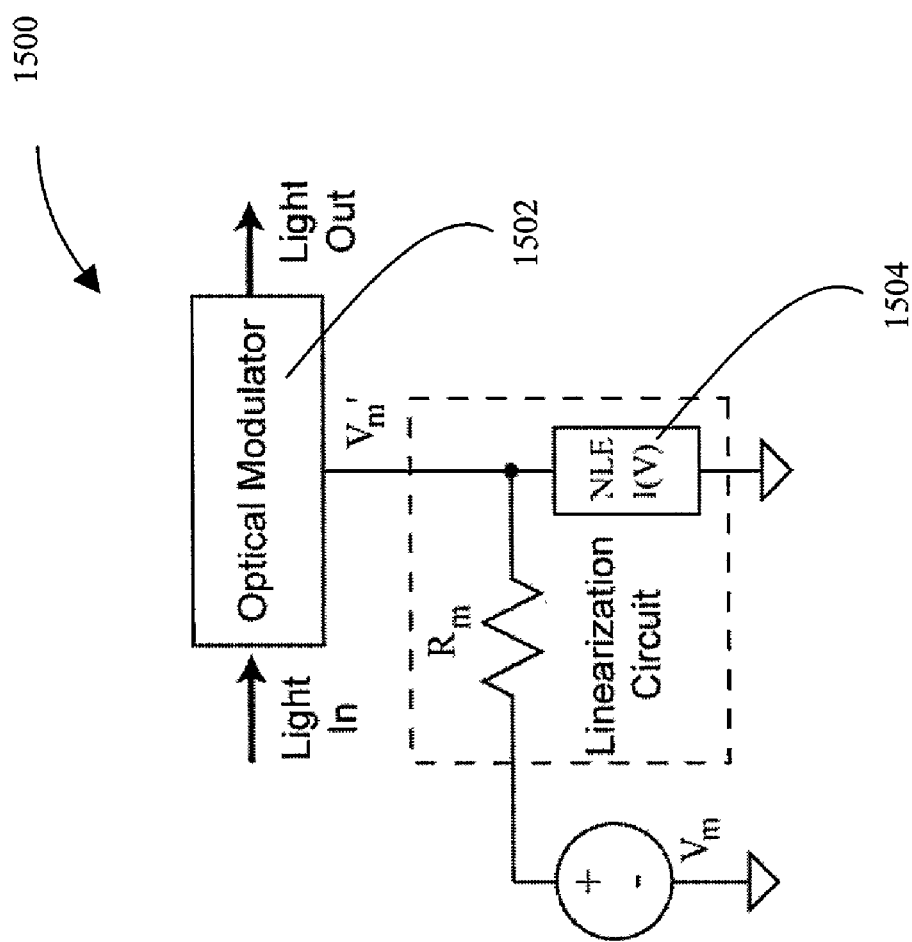
FIG. 15 is a circuit diagram of a exemplary linearization network applied to a voltage driven optical modulator.

FIG. 14 is a block diagram of linearization circuit 1400 for a laser diode that is an exemplary embodiment of the present invention. FIG. 15 is a block diagram of linearization circuit 1500 for a voltage driven optical modulator such as a (M-Z) Mach-Zehnder modulator. For both of these approaches, a linearization circuit 1400, 1500 is added to provide a predistortion to the drive current or voltage to linearize the resulting optical output. To linearize a laser diode, the linearization circuit subtracts an "error" current, $I_e$, from the drive current, $I_d$, such that a laser terminal current, $I_d'$, is adjusted to produce a light output linear with $I_d$. Similarly, to linearize a voltage driven modulator 1502 as shown in FIG. 15, a linearization circuit 1500 is added to appropriately adjust the voltage to result in a linear output light level in terms of the drive voltage $V_m$.

FIG. 14 depicts an exemplary circuit diagram of a laser diode linearization network that is an exemplary embodiment of the present invention. A special nonlinear element (labeled NLE) 1404 produces a linear light output in terms of the drive current, $I_d$. This linear light output, L, can be described in Equation 16 as:

$$L = \begin{cases} 0 & \text{for } I_d < I_o \\ \alpha \cdot (I_d - I_o) & \text{for } I_d \geq I_o \end{cases} \quad (16)$$

in which L is the light output, $\alpha$ is the slope of the output versus drive current, and $I_o$ is the zero light output current. The light output produced by the laser diode is some nonlinear function, $L_D(I_d')$, of the laser's drive current, $I_d'$, as shown by Equation 17:

$$L = L_D(I_d') \quad (17)$$

The objective is to have $I_d'$ be a function of $I_d$, such that Equation (16) and Equation (17) are identical, or algebraically for $I_d > I_o$:

$$\alpha \cdot (I_d - I_o) = L_D(I_d') \quad (18)$$

In practice, this equality can only be maintained over a limited device operating range. By current conservation:

$$I_d' = I_d - I_e \quad (19)$$

where $I_e$ the nonlinear element's terminal current which is a function the element's terminal voltage, V. The circuit dictates that V is:

$$V = V_d(I'_d) + R_d \cdot I'_d \qquad (20)$$

in which $V_d(I_d')$ is the laser diode's junction voltage.

After combining Equations (18), (19), and (20), and simplification to eliminate $I_d$, the necessary parametric function form for the nonlinear element required to linearize the light output is shown in Equation 21:

$$I_e(V_d(I'_d) + R_d \cdot I'_d) = \frac{L_D(I'_d)}{\alpha} - I'_d + I_o \qquad (21)$$

Since the laser characteristics $V_d(I)$, $R_d$, and $L_D(I)$ are known and $I_o$ and $\alpha$ can be selected as desired, the necessary $I_e(V)$ for linear operation is now known by this equation.

Referring to Equation (21), the product of $R_d$ and $I_d'$ is added to the laser diode's operating voltage in the nonlinear element's terminal voltage (argument on the left-hand side of equation). This allows for the nonlinear element to be realizable using a simple circuit as presented below.

Linearization of a voltage controlled light modulator is similarly performed as depicted in FIG. 15. In the circuit 1500 depicted in FIG. 15, a nonlinear element (NLE) 1504 has a voltage dependant current, which causes an input-voltage dependent voltage drop across the resistor, $R_m$. This voltage drop across $R_m$ is designed to precisely counteract the nonlinearity of the modulator. The objective is to provide a light output, which is linear with drive voltage:

$$L = \begin{cases} 0 \text{ for } V_m < V_o \\ \beta \cdot (V_m - V_o) \text{ for } V_m \geq V_o \end{cases} \qquad (22)$$

The light output from the modulator is determined by some known nonlinear function, $L_M$:

$$L = L_M(V'_m) \qquad (23)$$

Equating Equations (22) and (23), for $V_m > V_o$:

$$\beta \cdot (V_m - V_o) = L_M(V'_m) \qquad (24)$$

From FIG. 15, the voltage, $V_m'$, across the nonlinear element is:

$$V'_m = V_m - R_m \cdot (I_e(V'_m) + I_m(V'_m)) \qquad (25)$$

in which $I_m(V)$ is the modulators current and is zero for many voltage-controlled modulators. Equations (23), (24), and (25) can be solved for $I_e$ in terms of the modulator voltage $V_m'$ to give:

$$I_e(V'_m) = \frac{1}{R_m}\left(\frac{L_M(V'_m)}{\beta} + V_o - V'_m\right) - I_m(V'_m) \qquad (26)$$

Equation 26 gives the functional form of $I_e$ required for linear light output with $V_o$ and $\beta$ being free scalar parameters.

Thus, the necessary current voltage characteristics of the nonlinear element have been determined, but not the nonlinear element itself. Preferably, the nonlinear element is passive (plus diodes). This will restrict the nonlinear element to only exhibit a positive differential resistance/conductance. That is, the current can only increase (or remain constant) with increasing applied voltage. This places restrictions on the resulting modulation sensitivities ($\alpha$ and $\beta$).

For the laser diode linearization circuit, differentiating Equation (18) and solving for the partial derivative of $I_e$ with respect to $I_d'$ gives Equation 27:

$$\frac{\partial I_e}{\partial I'_d} = \frac{1}{\alpha} \frac{\partial L_D(I'_d)}{\partial I'_d} - 1 \qquad (27)$$

The left-hand side of Equation (29) must be positive since the differential resistance of the series combination of the laser diode and resistor, $R_d$, must be positive and as discussed above the conductance of the nonlinear element must be positive. Algebraically, $$\frac{\partial I_e}{\partial I'_d} = \frac{\partial I_e}{\partial V} \frac{\partial V}{\partial I'_d} \geq 0 \qquad (28)$$

Combining Equations (27) and (28) gives:

$$\alpha \leq \frac{\partial L_D(I'_d)}{\partial I'_d} \qquad (29)$$

for all operating currents, $I_d'$. This sets the linearized slope efficiency to be less than or equal to the original laser slope efficiency.

Similarly, for the voltage controlled optical modulator, assuming that the modulator conducts no current:

$$\beta \leq \frac{\partial L_M(V'_m)}{\partial V'_m} \qquad (30)$$

for all modulator voltages, $V_m'$. If the modulator conducts current, the slope efficiency will be lower because of the losses introduced by $R_m$.

Figure 16:
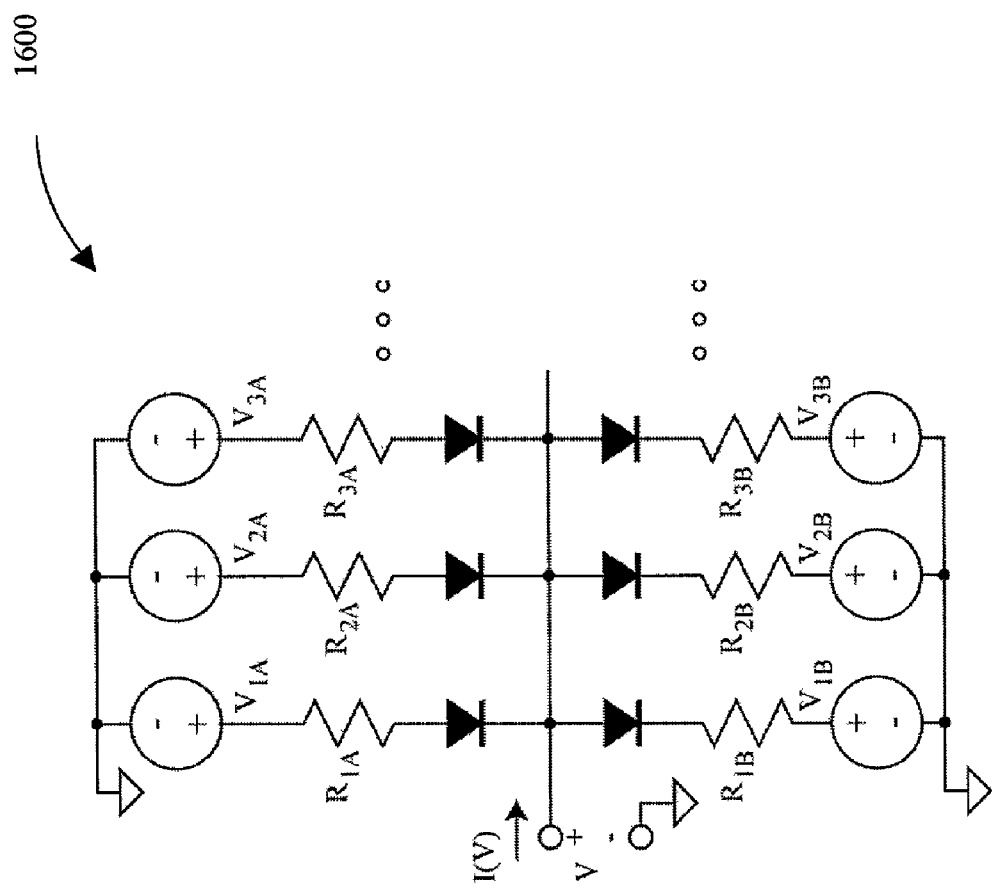
FIG. 16 is a schematic diagram of the general structure of a nonlinear element (NLE).
Figure 17:
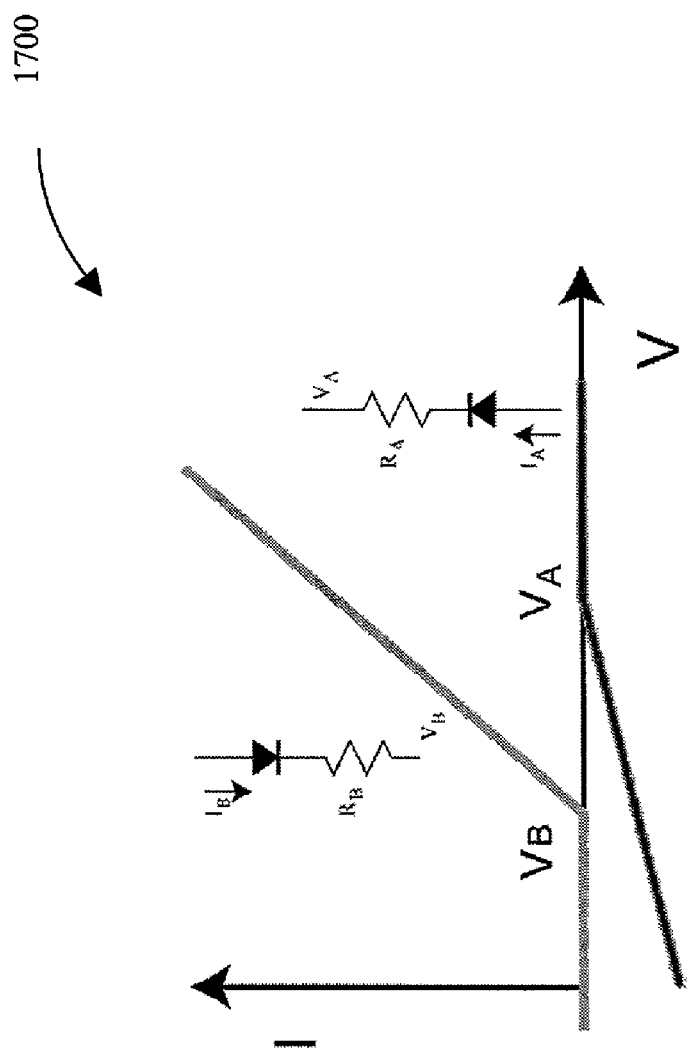
FIG. 17 is an illustration of the current contributions resulting from the two types of branch networks making up a nonlinear network.

An exemplary embodiment of the nonlinear element 1600 is shown in FIG. 16. For simplicity and ease of manufacture, the circuit 1600 comprises series-connected resistor and diode networks. These networks are biased to a set voltage (labeled $V_{nx}$), which along with the diode built in voltage sets a turn-on voltage where at above or below (depending on the diode polarity) the resistor is added into the circuit. The nonlinear response of typical configurations of each type of branch network is illustrated in the graph 1700 depicted in FIG. 17. Note that the basic I(V) characteristic of these networks is two linear segments separated by a voltage breakpoint. An appropriately selected plurality of these networks allows the synthesis of the shape of an arbitrary I(V) curve with the restriction of positive slope and the addition of an arbitrary offset current or voltage. This offset can fortunately be absorbed within the arbitrary offsets $I_o$ and $V_o$. The actual synthesis of the network is difficult analytically due to the lack of orthogonality of the resulting basis functions. Nevertheless, trial and error techniques with conventional circuit simulation programs can easily yield an effective network. Due to the basic I(V) characteristics of the branch networks (linear segments with voltage breakpoint), the resulting approximation will be a so-called "piece-wise linear approximation".

In actual implementation, voltage sources with the single series resistor configuration may not be used. Instead, a Thevenin equivalent network may be synthesized from the system power supply and a series combination of two resistors. The resistors $R_1$ and $R_2$ are selected such that:

$$V_A = \frac{R1}{R1+R2} V_{CC} \text{ and } R_A = \frac{R1 \cdot R2}{R1+R2} \quad (31)$$

where $R_1$ is connected from ground to the diode and $R_2$ is connected from the $R_2$ diode junction to $V_{cc}$.

The approach described herein addresses static linearization. The embodiments shown are anticipated to be integrated in microelectronic circuits allowing for very low parasitics and high-quality microwave diodes. Therefore, the linearization circuit may be expected to have a very large bandwidth. It may be assumed that the dynamic response of the laser diode or optical modulator is the same as static up to the operating speed. This is justified by the fact that an optoelectronic or electronic device's operational bandwidth is roughly defined by the frequency where the dynamic performance is no longer similar to the static and it is assumed that the device being linearized is being operated at a frequency within it's bandwidth. Additionally, it should be obvious to one skilled in the art that reactive impedance matching can occur between the device and the linearization network to help mitigate this issue.

In summary, the linearization network illustrated in FIG. 14 works by a nonlinear element shunting the appropriate amount of current from a drive current to result in a linear light output of a nonlinear current drive optical modulator device. Similarly, as illustrated in FIG. 15, a voltage controlled nonlinear optical modulator device, is linearized by the addition of a series resistance, which converts the nonlinear shunt current into a nonlinear voltage drop to result in a linear light output. The topology of the nonlinear element is illustrated in FIG. 16. In this circuit a plurality of shunt connected diode-resistor circuit branches are selected to synthesis the required nonlinear current vs. voltage curve to linearize the optical modulator.

The light source is assumed to be amplitude controlled and of adequate coherence to be used in WDM systems. It is desired that the source be as linear as possible, though as just described in the previous section, linearization networks can be used to improve linearity. The light source will need to have an electrical bandwidth commensurate with the symbol rate of the communication link. This will be much lower than the link's aggregate data rate and therefore represents significant cost advantage at moderate speeds (less than or equal to 10 Gb/s) and enabling technology at high data rates (over 40 Gb/s). Preferred light sources include direct modulation of laser diodes, and externally modulated laser sources (i.e., Mach-Zehnder, or Electro-Absorptive modulators).

An Exemplary Receiver

Figure 18:
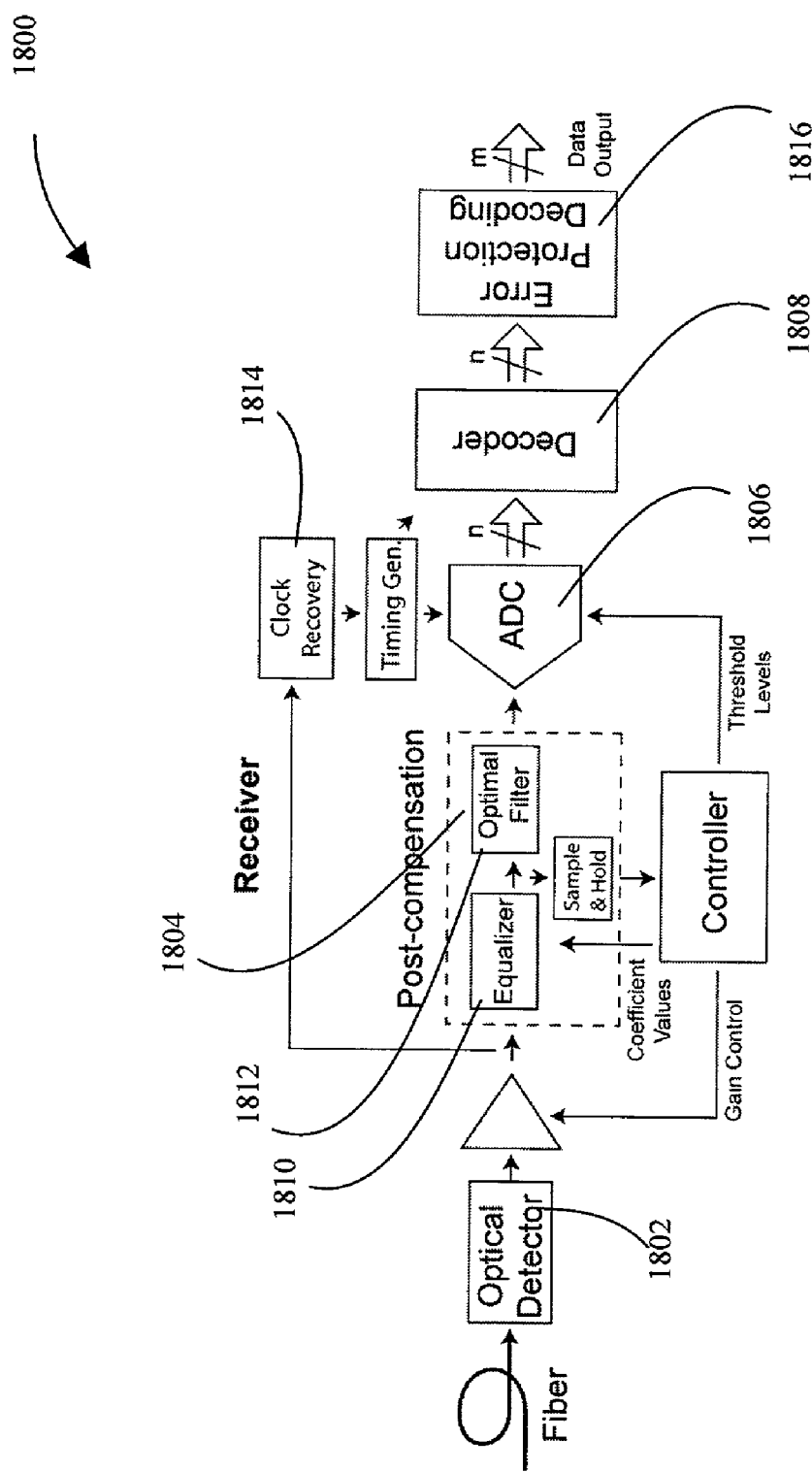
FIG. 18 is a block diagram of an exemplary receiver.

FIG. 18 is a block diagram depicting a multilevel ASK optical receiver 1800 that is an exemplary embodiment of the present invention. The receiver 1800 typically comprises an optical detector 1802, distortion post-compensation circuits 1804, an Analog to Digital Converter (ADC) 1806, an n-channel decoder 1808, and an error protection decoding (EPD) module 1816. The combination of the distortion post-compensation circuits 1804, an Analog to Digital Converter (ADC) 1806, an n-channel decoder 1808, and an error protection decoding (EPD) module 1816 may be referred to as a desymbolizer. The electronics of receiver 1800 are termed the "desymbolizer", because they convert the received symbols back into one or more binary output data streams. The optical detector 1802 converts a $2^n$-level optical signal into a $2^n$-level electrical signal, which is then processed by post-compensation circuitry 1804. The post-compensation circuitry 1804 comprises an adaptive equalization means 1810 as well as an optimal detection filtering means 1812. The output of the compensator 1804 is input to an ADC 1806, which converts the $2^n$-level signal into n digital data streams. The ADC 1806 can employ a novel statistical automatic threshold determination means, which will allow for compensation of some of the link nonlinearities. These n channels are input to a decoder 1808, which converts a coded n-bit word each clock cycle into the corresponding n-bit word that was initially input to the transmitter encoder shown in FIGS. 5 and 6. The original data input to the transmitter is then obtained from the EPD 1816 by decoding the error protected data using the redundant bits introduced by the transmitter's EPC 510 (FIG. 5) to correct errors in the received data. A clock recovery circuit 1814 can be used to generate the necessary timing signal to operate the ADC 1806 as well as output synchronization. In an exemplary embodiment of the multilevel receiver 1800, a 16-level amplitude-modulated signal can be detected by the photodetector 1802 and ultimately converted to four digital data streams in order to realize a four times improvement in bandwidth of the transmission system. Analog-to-digital conversion and Q-Gray code-based decoding for a 16-level signal are summarized in Table 3. All of these functional blocks, less the optical detector 1802, can be integrated in one circuit or on multi-chip module.

TABLE 3

ADC output and Q-Gray decoding

| Level Input to ADC | Four-Bit Word Input to Q-Gray Decoder | Four-Bit Word Output from Q-Gray Decoder |
|---|---|---|
| 15 | 1111 | 1000 |
| 14 | 1110 | 1010 |
| 13 | 1101 | 1110 |
| 12 | 1100 | 1100 |
| 11 | 1011 | 0100 |
| 10 | 1010 | 0101 |
| 9 | 1001 | 1101 |
| 8 | 1000 | 1001 |
| 7 | 0111 | 1011 |
| 6 | 0110 | 1111 |
| 5 | 0101 | 0111 |
| 4 | 0100 | 0110 |
| 3 | 0011 | 0010 |
| 2 | 0010 | 0011 |
| 1 | 0001 | 0001 |
| 0 | 0000 | 0000 |

The optical detector 1802 and following trans-impedance amplifier (TIA) should exhibit good linearity over the entire receiver dynamic range. Fortunately, a conventional PIN detector in conjunction with an analog TIA offers good linearity over wide signal ranges. Additionally, the adaptive thresholding discussed below as well as the pre-distortion discussed above will compensate for system nonlinearities. The TIA is assumed to have a gain control, which will be used to produce a signal output of fixed amplitude.

Figure 19:
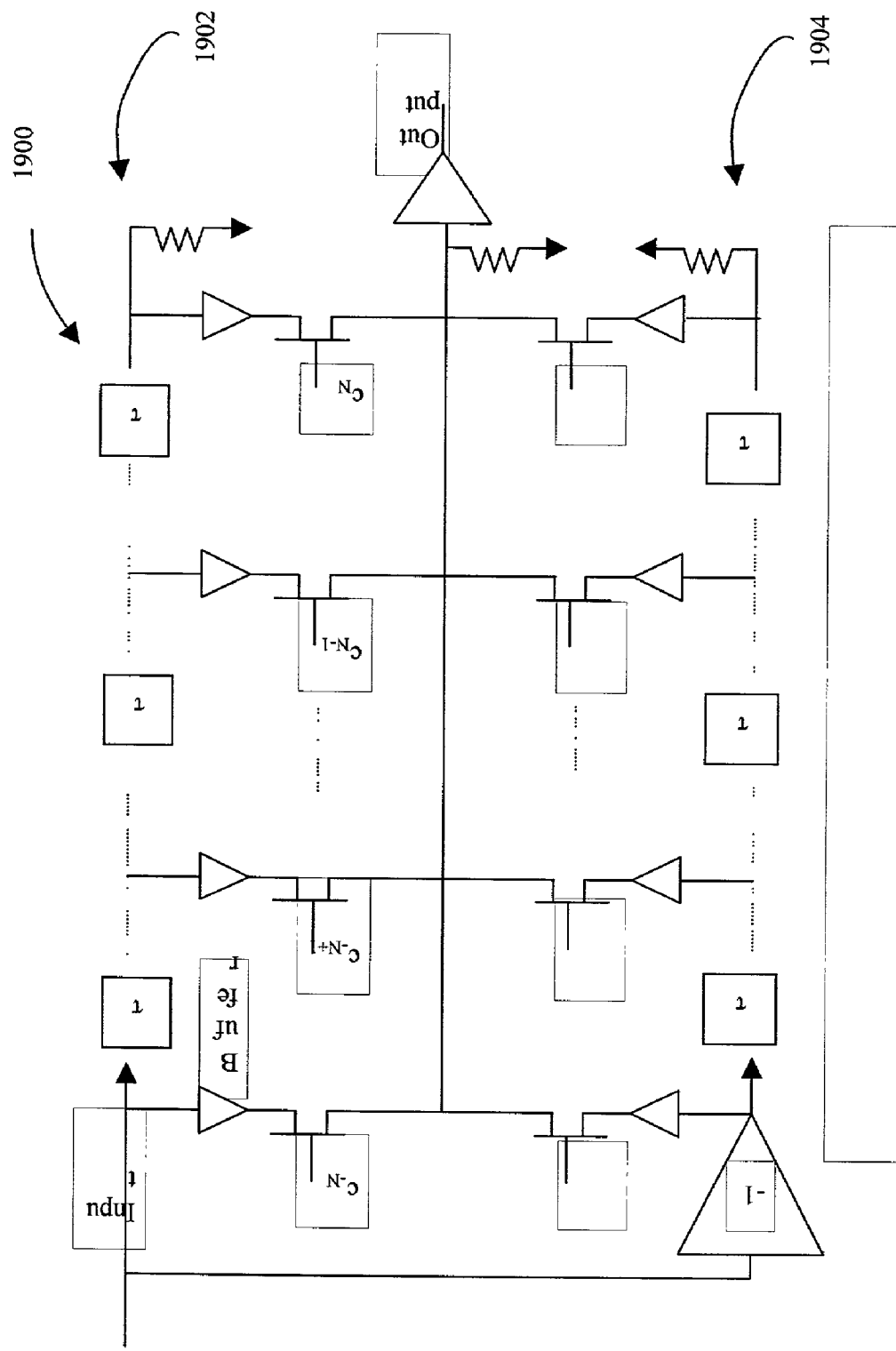
FIG. 19 is a block diagram of an exemplary programmable transversal filter (PTF).

FIG. 19 is a block diagram depicting an exemplary embodiment of a transversal filter 1900. This circuit 1900 forms a classical transversal filter or equivalently a finite impulse response filter (FIR) filter, which can synthesize an arbitrary frequency response based on the tap gains/coefficients. Here, equalizer tap gains can be determined by the output conductance of FETs. Controlling both the size of FET and the gate bias voltages sets the output conductances. These control FETs are appropriately scaled to minimally impact the input signal propagating down the delay transmission line(s). The input is assumed to either be differential or single-ended with the circuit generating an inverted form of the input as shown in FIG. 19. This is required to allow for the filter coefficient to be either positive or negative depending on which FET is activated ($c_i^-$ or $c_i^+$).

In this circuit 1900, an input signal is divided into two parts. One part propagates down the upper cascade of delay-lines of equal delay 1902; whereas the other part is inverted and propagated down the lower cascade of delay lines 1904. Alternately, a differential signal can be applied to the upper 1902 and lower 1904 delay line cascades without the need for a signal inverting means. The two transmission line cascades can provide a means for supporting both positive and negative gain coefficients. From each junction of the delay-lines a high-input impedance amplifier (e.g., 1906) is used to sample the signal without significantly distorting the signal propagating down the delay-line cascade. From each of these buffers is a FET (e.g., 1908) (drain or source connected), which is used as a variable resistor means. The other terminal (source or drain) of these variable resistance FET's is connected to a common node 1910 at which point signal summation occurs. From this node is a resistor 1912 that is of sufficiently low impedance to mitigate coefficient interdependence, which would be caused by the varying impedance of this summation node as various taps are controlled. The resulting summation is then amplified and output.

Figure 20:
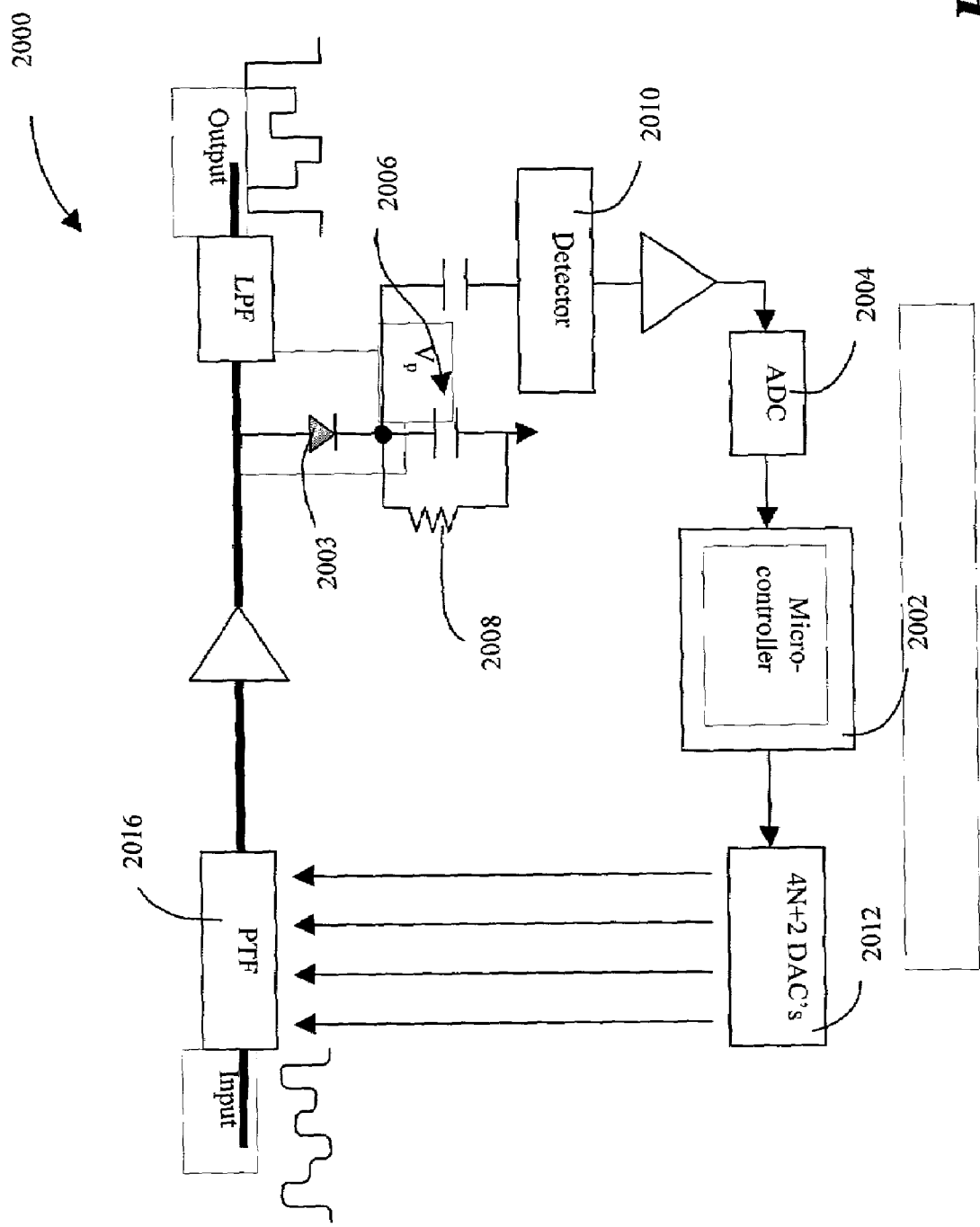
FIG. 20 is a block diagram of an exemplary adaptive equalizer.

FIG. 20 is a block diagram depicting an adaptive transversal filter 2000 for the multi-level optical transmission system that is an exemplary embodiment of the present invention. In this embodiment, the spectral amplitude of the received symbol is adjusted based on equalizer tap gains which are calculated in the microcontroller 2002 in order to remove the effect of intersymbol interference.

The peak voltage of the received signal, $V_p$ is detected by a diode 2003, capacitor 2006, and resistor 2008. Ideally, with a frequency independent (equalized) channel, the peak voltage would be constant over time. If the optical channel is not equalized, the measured peak voltage will vary with time. This occurs due to the time dependent frequency content of a random data stream. Thus, the sampled peak voltage is measured and fed into the microcontroller 2002 through the ADC 2004. The job of the microcontroller 2002 is to appropriately select the gain coefficients of the PTF to make the measured peak voltage constant in addition to removing ISI which corrupts the other signal levels in the same manner as the peak. Since there may be no knowledge of the frequency content of the random data at any given time, the measured peak voltage fluctuation can only give a measure of goodness and not direct knowledge of appropriate PTF settings. Therefore, the microcontroller 2002 must perform a multidimensional optimization (4N+2 variables) to minimize a single scalar quantity. Fortunately, those skilled in the art will realize that many numerical techniques can be brought to bear to solve this problem (e.g., minimum mean-squared error method, gradient methods, bisection, genetic algorithm, etc.). One of the numerical techniques is employed and the microcontroller 2002 repeats this procedure to determine the appropriate equalizer tap gains (weights).

The sampling rate must be adjusted appropriately to the received data stream's random properties. Typically one would sample the data sufficiently fast that the frequency content of the signal (and especially the ISI) is observed. However, the practical maximum sampling rate is limited by the cost of such a high-speed ADC. Nonetheless, one may still observe the effects of ISI through the peak stability or the "wellness" of the measured histogram as described later. Consequently, such a measure of goodness (based on slowly sampled data) may be used in an optimization algorithm to determine the filter coefficients. Effective sample rates of $1/10^{th}$ to $1/100^{th}$ the high-speed data rate should be sufficient in the proposed approach For example, at 10 Gsym/s data rates, a 10 ns sampling time appears appropriate ($1/100^{th}$ of the 0.1 ns bit period). This sampling speed (100 Msps) is readily available using current technology. A preferred embodiment would AC couple the output of the detector circuit 2010 and peak detect the fluctuation amplitude. Then, the microcontroller 2002 can sample the fluctuation level on demand at a rate commensurate with the control algorithm (<1 Msps) and optimize the filter coefficients.

The output of the microprocessor's 2002 optimization algorithm is fed into DACs 2012 to control the equalizer tap gains by varying the gate voltages of FETs. Equalization filters are known to commonly amplify high-frequency noise. To address this issue, a low pass filter (LPF) 2014 is placed after the equalization filter.

In the embodiment shown in FIG. 20, a high-speed multilevel data stream can be routed through the circuit 2000 on the signal path shown in bold. The high-speed data stream first passes through the programmable transversal filter (PTF) 2016, which frequency equalizes the signal. The high-speed signal can then be amplified as appropriate and low pass filtered (LPF) to minimize that typical noise amplification caused by the PTF 2216. The high-speed data stream is monitored after the PTF 2016 by a simple peak detector circuit comprised of a diode 2003, resistor 2008 and capacitor 2006. The output of the peak detector circuit is appropriately signal conditioned by removing the DC component and again power detected (envelope, Root-Mean-Square (RMS), or other means is sufficient), filtered, amplified and fed to the ADC 2004 of a microcontroller 2002. The microcontroller 2002 samples the ADC and by an iterative algorithm based on the fluctuations of the envelope of the high-speed signal determines the best settings of 4N+2 DACs 2012, which control the 4N+2 coefficients of the PTF 2016. This allows for the automatic equalization of a high-speed multilevel communication data stream in a means, which does not interrupt the data flow.

Figure 21:
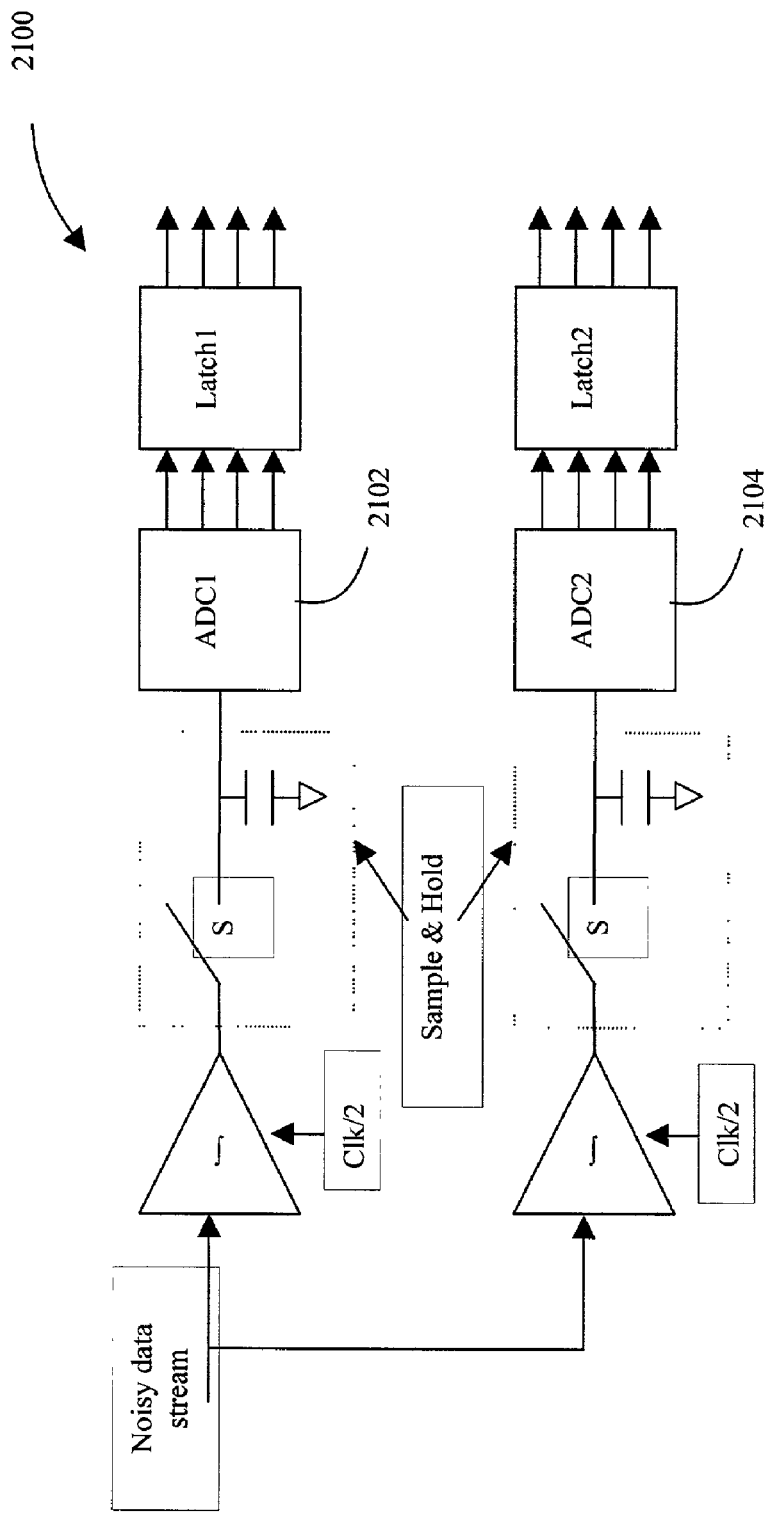
FIG. 21 is a block diagram of an exemplary multi-level parallel noise filter.

FIG. 21 is a block diagram depicting an exemplary optimal filtering circuit 2100, which can be used at very high data rates. This circuit 2100 uses a novel method for parallel noise filtering and detection implementation using integrate and dump filters (IDFs). IDFs form the optimal correlation detection for simple rectangular data symbols (correlates a rectangle with a rectangle). At high data rates, it is normally difficult to realize IDFs that can "dump" fast enough to correlate the next symbol. The approach described here overcomes this limitation by parallel processing the received data. This approach also provides the additional feature of allowing for serial to parallel data conversion without requiring an additional demultiplexer circuit in the receiver resulting in receiver simplification. Additionally, this approach reduces the speed requirement of the ADCs 2102, 2104 as each converter samples at a rate reduced by the number of IDF circuits. The approach can be extended to higher orders of parallelism (N channels) depending on the level of demultiplexing desired as well as the speed restrictions of available ADC circuits.

The received signal from the equalization filter or receiver is split and fed into the two IDFs. The dump filters consists of an integrator (i.e. RC circuit) and switch (i.e. transistor). The number of dump filters employed may vary depending on the data rate and the limitations of component performance. A clock is used for the dumping pulse of the integrator and will be extracted from the received signal using a clock recovery circuit followed by a divide-by-two frequency divider. A clock recovery circuit can be implemented using edge detectors with phase-locked loops or bandpass filters and comparators. With two IDFs, the recovered ½ clock and inverted ½ clock signals are adequate to operate the IDFs switches as well as the sample-and-hold (SH) circuits or track-and-hold circuits, which hold the result of the IDFs at the end of the symbol period for thresholding by the analog-to-digital converters. The data stream is integrated during alternate symbol periods (clock/2) in the IDF filters. This allows for parallel operation resulting in the demultiplexing of the data stream into even and odd symbol data streams. Then, the even and odd data streams can be sampled and multilevel thresholded by the SH and ADC. The resulting binary signals can be sent to latches to temporally align the results from the two parallel channels. The result is the thresholded output of two symbols once every two-symbol periods. The specific clock pulses used are not shown in FIG. 21 due to the hardware specific nature of the ADC and SH circuits. In general terms, after the end of a given symbol period, the active IDF filter is sampled by the corresponding SH and the corresponding ADC is initiated. Simultaneously, the other IDF filter is made active and begins to perform the correlation of the input signal. This process is continued with each channel (signal path comprised of an IDF, SH and ADC) processing alternate symbols.

Table 4 shows the sequence of events during several symbol periods. The "*" represents the SH sample point. Note that the latched outputs are both valid over any given symbol period.

TABLE 4

Timing diagram for a two-channel receiver around the reception of the ith bit.

| | Symbol Period | | | |
|---|---|---|---|---|
| Circuit | i − 1 | i | i + 1 | i + 2 |
| IDF 1 | Dump | Active | Dump | Active |
| SH 1 | Hold i − 2 | * | Hold i | * |
| ADC 1 | Convert i − 2 | | Convert i | |
| Latch 1 | Valid i − 4 | | Valid i − 2 | Valid i |
| IDF 2 | Active | Dump | Active | Dump |
| SH 2 | * | Hold i − 1 | * | Hold I + 1 |
| ADC 2 | | Convert i − 1 | | Convert i + 1 |
| Latch 2 | | Valid i − 3 | | Valid i − 1 |

This approach can be extended to an arbitrary number of channels allowing for additional speed-performance reduction of the components in each channel as well as for higher levels of demultiplexing.

Figure 22:
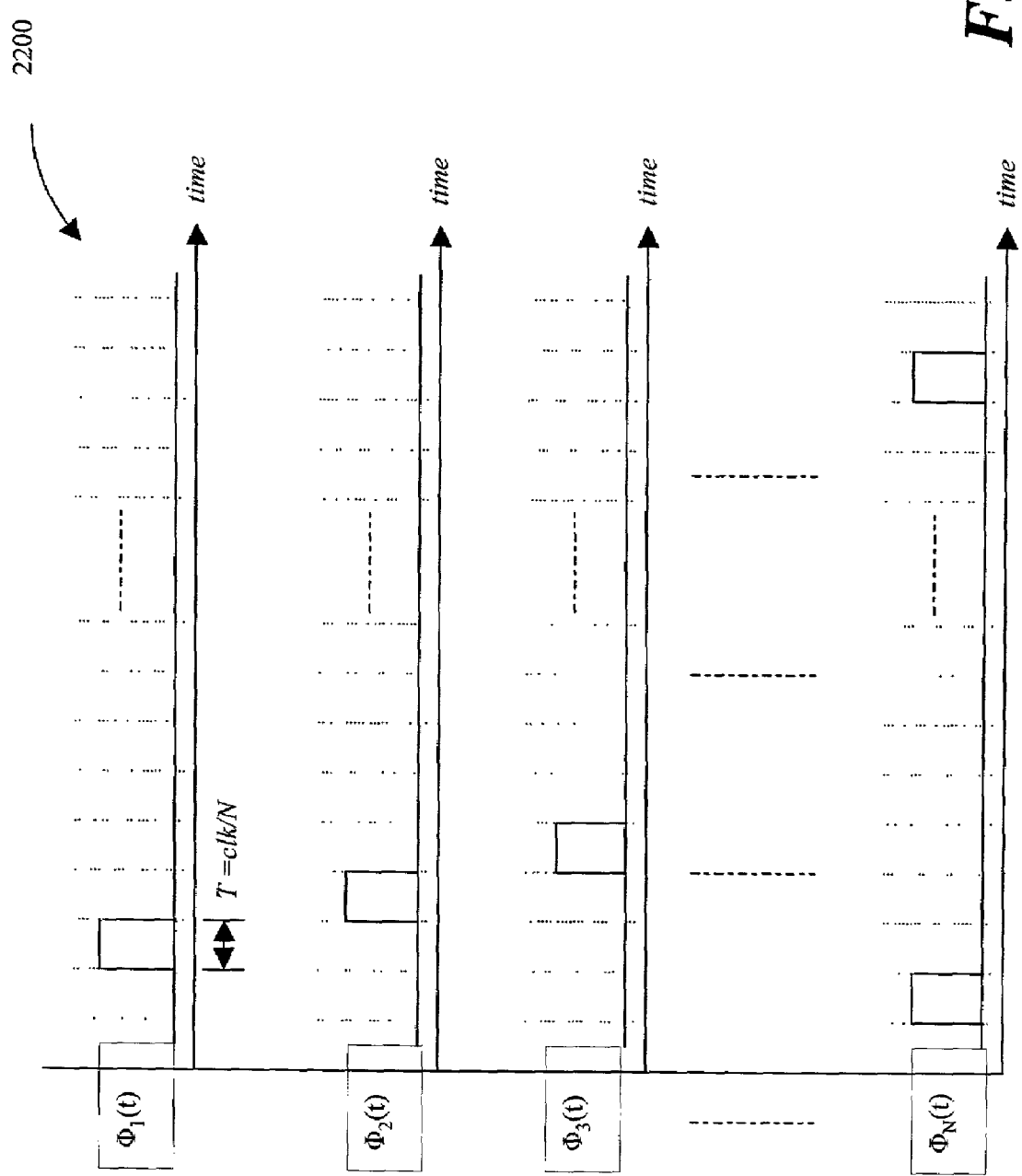
FIG. 22 is a timing diagram for an exemplary N-channel parallel optimal-filter.
Figure 23:
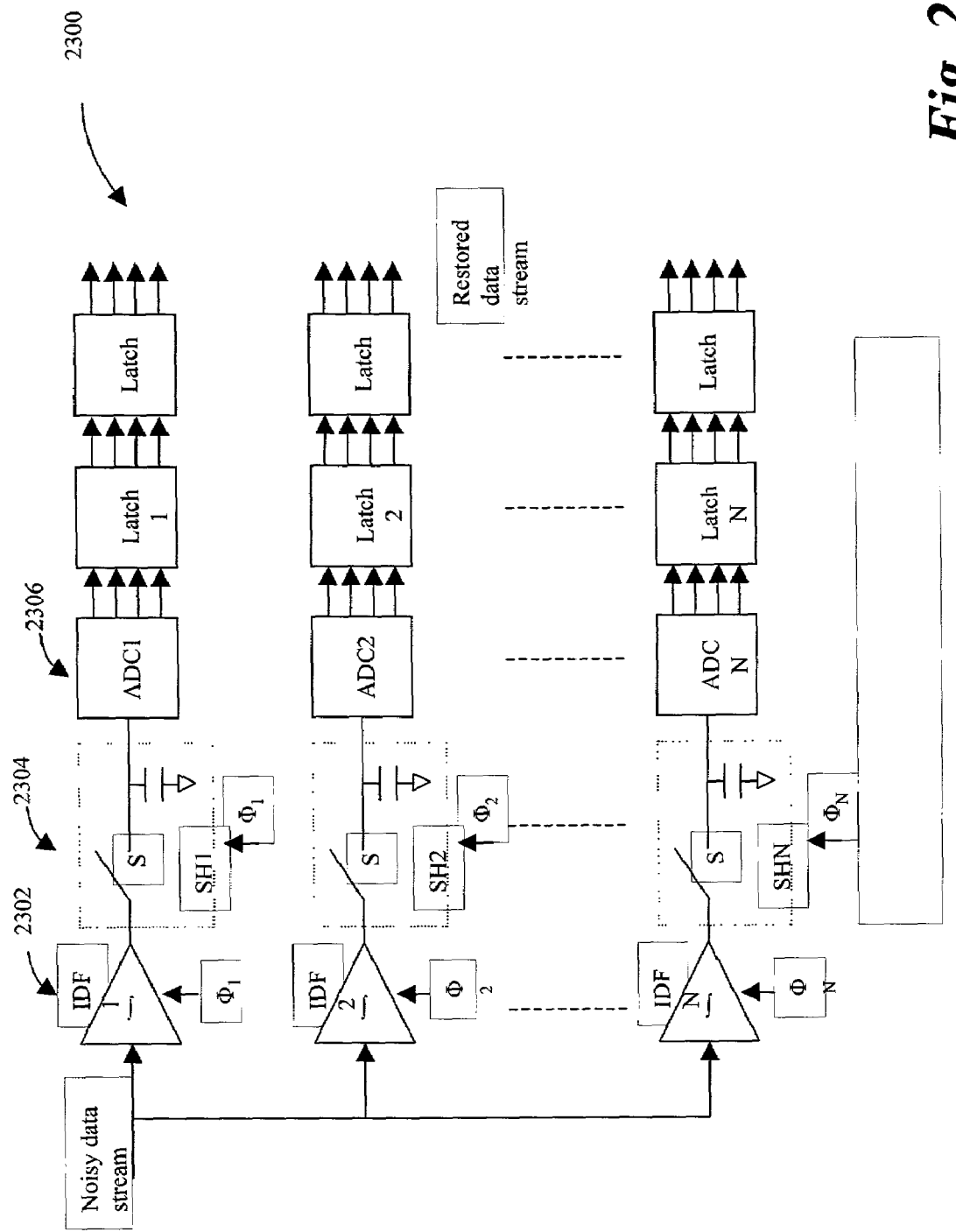
FIG. 23 is a block diagram of an exemplary N-channel parallel optimal-filter.

FIG. 23 is a block diagram depicting an exemplary N-channel filter 2300. Additional channels will require correspondingly increased complexity clock generation as illustrated in FIG. 22. A multiphase clock must be used to properly sequence through operation of the multiple IDF, SH, and ADC functions.

Generally, the N-channel filter 2300 operates by sequentially activating the IDF circuits 2302 for one symbol period each. At the end of the symbol time, the SH (e.g., 2304) (sample-and-hold or track-and-hold circuits) holds the result of the correlation function performed by the IDFs. The ADC is then triggered and performs the multi-level thresholding. When the ADC is complete (should be completed in less than N symbol times), the result is latched into the first set of latches. After all N-channels have valid results; the final N symbol-result is latched into the output latches. The final N symbol-results remain valid for N symbol time periods or equivalently until the next N symbols are processed. This system forms a pipelined detection approach, which significantly alleviates the speed requirements of the ADCs.

The Analog-to-Digital Converter (ADC) (e.g., 2306) may be a conventional uniformly-leveled converter of adequate speed and resolution or the preferred embodiment described below. Since the ASK signal may be significantly distorted by the nonlinearities of the optical link, the received levels may no longer be uniformly spaced during detection at the receiver.

Figure 24:
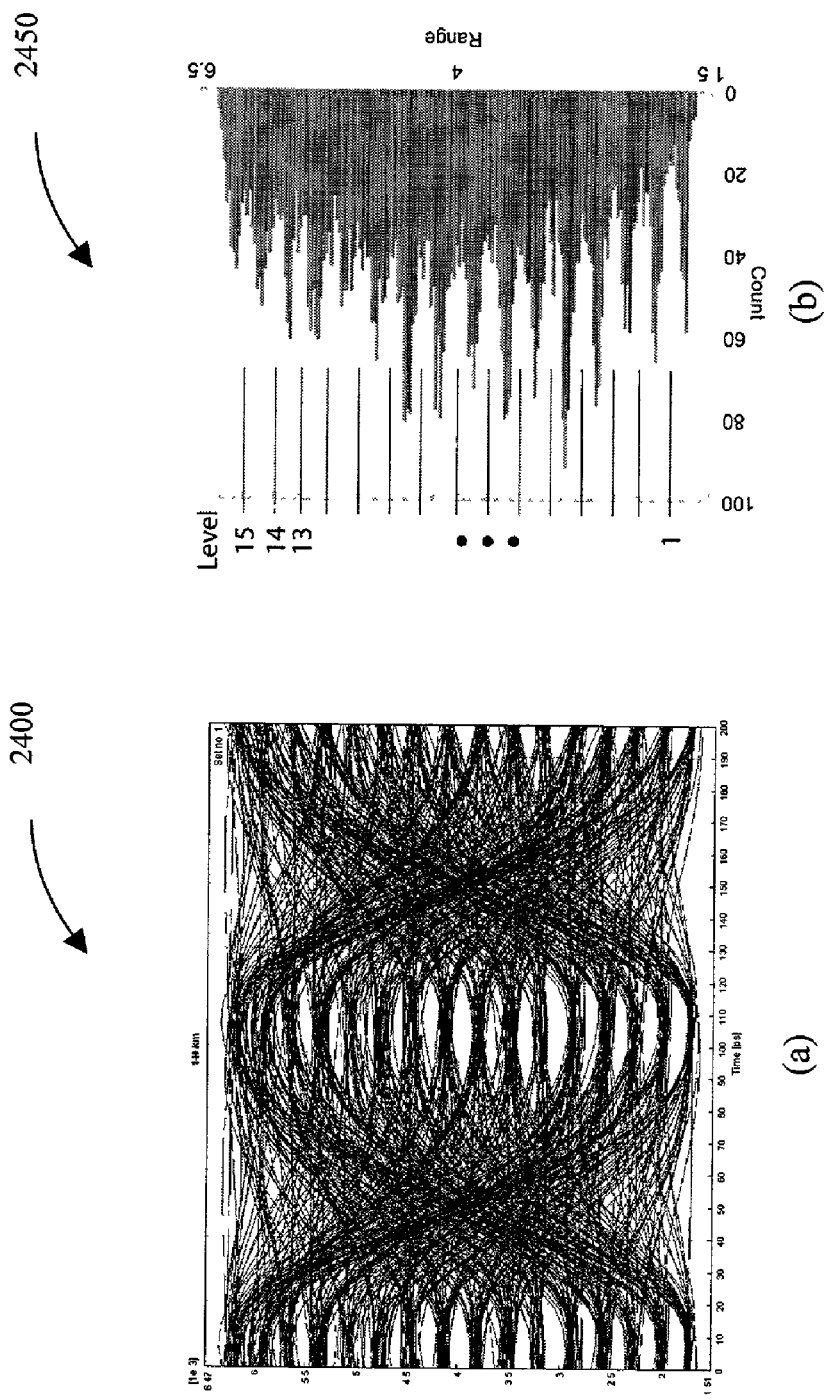
FIGS. 24 (a) and (b) are an eye-diagram of the simulated data of a 16-level transmission and a histogram of the data, which clearly shows the location of the "eyes".

A simulated multi-level eye diagram of a 16-level signal transmitted through a hypothetical fiber link (10 Gb/s optical link sent through a 140 km fiber length with a single EDFA) is shown in FIG. 24. This simulation illustrates the difficulty in determining the thresholds for multilevel data streams. From this simulation, it is apparent that the eyes are non-uniform in noise and level after generation, transmission, and detection in an optical system. It is desired to have voltage detection thresholds centered in the statistical center of each of the 15 "eyes". Since the eyes are no longer uniformly distributed in voltage, a simple conventional direct ADC at the minimum number of bits ($\log_2(16)=4$ in this case) is no longer possible. Hypothetically, the received voltage signal could be digitized at a higher resolution (additional bits) and signal processing applied to determine the correct level. Unfortunately, at the targeted symbol rates of many optical systems (i.e. OC-192 at 10 Gb/s) this would require order-of-magnitude speed improvements of readily available ADC and signal processing technologies.

For this exemplary embodiment, the received analog signal is sampled at random points in time and a histogram of the measured voltages is formed as illustrated in FIG. 24. This histogram is comprised of a finite number of the most recent "n" samples. As a new sample is determined, the oldest is removed from the sample set. A simple computer search algorithm can then be used to track the center of the eyes for the statistically optimized threshold/decision point for the receiver decision circuit(s).

These temporally random samples must be performed at a voltage resolution in excess of the number of levels used in the high-speed data transmission. In particular, in order to determine the location of the peaks and valleys of the resulting histogram, the Nyquist theorem dictates that the sample resolution be as a minimum twice that of the number of data levels in the high speed data stream (i.e. 5 bits for 16 levels). In practice, ADC technology is readily available to allow for significant voltage resolution over-sampling (say 14 bits).

Ideally samples would occur at times centered temporally in the high-speed data stream's eyes. This would require critical timing requirements and therefore not be expected to be cost effective. Instead, the voltage samples can be easily made at random times thereby allowing for the elimination of all critical timing circuitry. The result of random signal voltage sample times is similar to the ideal sampling case due to the larger probability of sampling during a signal transition. This results in a data "floor" in the histogram, which can be easily removed during subsequent signal processing. Random sampling for this application means random to the high-speed data rate. This can be achieved by using a periodic sample rate, which is not harmonically related to the high-speed data rate. The actual average sample rate of the random voltage samples is dictated by the threshold update speed desired. If the communication channel is expected to vary quickly with time, the sample rate must be correspondingly high. As an example, assuming that the channel varies with a 10 ms characteristic time and 1000 samples forms the histogram; average conversion speed only need be 100,000 samples per second.

This approach can additionally provide information of the "wellness" of the received signal. For example, the ratio of the number of samples within the eyes to the peaks between the eyes will relate directly to error rate. Additionally, these types of ratios along with measured signal levels would provide very useful information to select the operating point of programmable analog signal processing modules prior to this process. For example, the tap weighting coefficients of a programmable delay line equalization filter could be adjusted for maximum data "eye-opening". Advantageously, this approach can be applied to the optimal detection of multi-level signals of any number of levels (2 to infinity).

Figure 25:
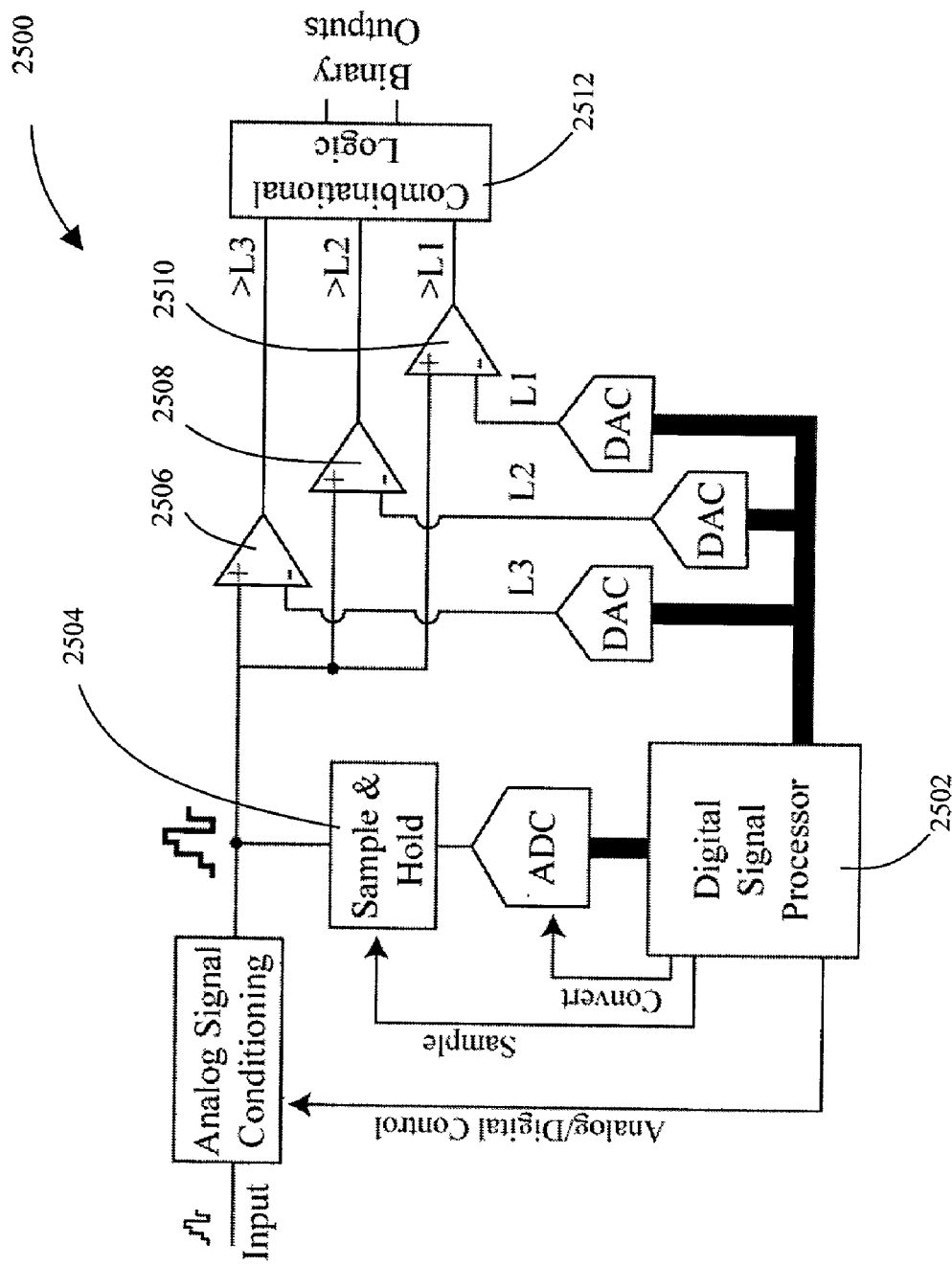
FIG. 25 is a block diagram of an exemplary 4-level multi-level receiver.

FIG. 25 is a block diagram depicting an exemplary multi-level receiver 2500. The diagram is shown for a 4-level receiver, but it should be obvious to one skilled in the art that this circuit can be readily extended to any number of levels. For 4-levels ($2^n=4$), there is necessarily 3 (i.e., $2^n-1$) voltage decision levels. These levels are determined by the Digital Signal Processor (DSP) 2502 based on the sampled voltage levels.

Specifically, the DSP 2502 would sample the received analog voltage by triggering the sample-and-hold circuit 2504 or equivalently a track-and-hold circuit at some time random in relation to the received data stream. The sample/track-and-hold circuits 2504 will necessarily have a capture bandwidth commensurate with the high-speed data stream, but will only need to be able to sample at rate much lower than that of the high-speed data stream. The DSP 2502 would then trigger the ADC conversion and record the resulting voltage. The DSP 2502 would continue this process until adequate statistic information can be gathered to determine the appropriate decision levels. Typical time sample set sizes are expected to be on the order of 100 to 1000, though larger or smaller sample sizes can also be selected. The actual sample size should be adequate to determine the resulting Gaussian probability peaks with adequate accuracy to sufficiently determine the eye centers. When a new sample is recorded, the oldest will be rejected from the sample set. The statistical analysis will be continually performed; thereby adjusting the decision levels in real time to compensate for time varying distortion/noise of the received signal. Additionally, the "wellness" of the data may also be used to feedback control signals to analog signal conditioning circuits to provide an improved eye opening for reduced error rate.

These voltage decision levels are then used by three high-speed comparators 2506–2510, which are followed by combinational logic 2512 to properly decode the levels back to the encoded data streams. The three comparators 2506–2510 and combinational logic 2512 are closely related to a traditional flash ADC with the exception of optimal threshold control (as per present invention) and decoding methods more amenable to communication systems than binary. The receiver converts the multi-level input into properly decoded data streams. It should be obvious to one skilled in the art that this circuit can be expanded to n-level transmissions by incorporating n–1 high-speed comparators, a more complex decoding logic, and a higher resolution low-speed ADC for statistic signal sampling.

One skilled in the art will understand that various combinational logic circuits can be designed to perform the decoding function block 2712. As illustrated by Table 5, adjacent levels output by an ADC effect a change of only one bit in the decoded four-bit words. These types of decoding techniques are well known to those skilled in the arts. A discussion of these techniques is given in "Digital and Analog Communications" by Gibson, published by Macmillan Publishing Company in 1993.

Although the present invention has been described in connection with various exemplary embodiments, those of ordinary skill in the art will understand that many modifications can be made thereto within the scope of the claims that follow. Accordingly, it is not intended that the scope of the invention in any way be limited by the above description, but instead be determined entirely by reference to the claims that follow.

What is claimed is:

1. A method for increasing the channel data rate throughput in an optical fiber communication system while minimizing a bit error rate, the method comprising the steps of:
   receiving a digital input signal, comprising a series of input pulses, each input pulse having one of two pulse levels;
   creating a digital input word having n bits from the digital input signal;
   converting each digital input word to a corresponding output symbol representing one of $2^n$ distinct values;
   generating an output signal comprising a series of output symbols; and
   modifying a first output symbol, according to a signal property of a preceding output symbol and a signal property of a succeeding output symbol.

2. The method of claim 1, wherein the step of modifying the first output symbol comprises accessing a look-up table to determine an appropriate modification of a signal property of the first output symbol.

3. The method of claim 1, wherein the step of modifying the first output symbol is performed by a precompensation circuit.

4. The method of claim 1, wherein the digital input signal is received from n separate channels, the output signal having n times higher data rate than that of one of the n separate channels.

5. The method of claim 1, wherein the digital input signal is received from a single channel.

6. The method of claim 1, wherein the spectral occupancy of the optical signal is minimized.

7. The method of claim 1, wherein the signal property of the preceding output symbol is a first amplitude and the signal property of the succeeding output symbol is a second amplitude and further comprising the step of interrogating the output signal to determine an amplitude of the first output symbol.

8. The method of claim 7, further comprising the step of interrogating the output signal to determine the amplitude of the preceding output symbol.

9. The method of claim 7, further comprising the step of interrogating the output signal to determine the amplitude of the succeeding output symbol.

10. The method of claim 7, wherein the first output symbol, is delayed to determine the amplitude of the succeeding output symbol.

11. The method of claim 10, wherein a transmission line is used to delay the first output symbol for a first delay time.

12. The method of claim 10, wherein a digital register is used to store the first output symbol, thereby delaying the first output symbol for a first delay time.

13. The method of claim 7, wherein the preceding output symbol, is delayed to determine the amplitude of the first output symbol.

14. The method of claim 13, wherein a transmission line is used to delay the preceding output symbol for a second delay time.

15. The method of claim 13, wherein a digital register is used to store the first output symbol, thereby delaying the first output symbol for a first delay time.

16. The method of claim 1, wherein the step of modifying the first output symbol comprises modifying an amplitude of the first output symbol.

17. The method of claim 16, wherein the step of modifying the amplitude of the first output symbol comprises modifying the amplitude of the first output symbol based on the amplitude of the first output symbol.

18. The method of claim 16, wherein the step of modifying the amplitude of the first output symbol comprises modifying the amplitude of the first output symbol based on the amplitude of the preceding output symbol.

19. The method of claim 16, wherein the step of modifying the amplitude of the first output symbol comprises modifying the amplitude of the first output symbol based on the amplitude of the succeeding output symbol.

20. The method of claim 16, wherein the step of modifying the amplitude of the first output symbol comprises modifying the amplitude of the first output symbol based on the phase of the first output symbol.

21. The method of claim 16, wherein the step of modifying the amplitude of the first output symbol comprises modifying the amplitude of the first output symbol based on the phase of the preceding output symbol.

22. The method of claim 16, wherein the step of modifying the amplitude of the first output symbol comprises modifying the amplitude of the first output symbol based on the amplitude of the succeeding output symbol.

23. The method of claim 1, further comprising the step of further modifying the first output symbol, according to an amplitude of a second preceding output symbol and a second succeeding output symbol.

24. The method of claim 1, wherein the signal property of the preceding output symbol is a first frequency, the signal property of the succeeding output symbol is a third frequency and the signal property of the succeeding output symbol is a second frequency and further comprising the step of interrogating the output signal to determine a frequency of the first output symbol.

25. The method of claim 24, wherein the step of modifying the first output symbol comprises modifying the frequency of the first output symbol.

26. The method of claim 25, wherein the step of modifying the frequency of the first output symbol comprises modifying the frequency of the first output symbol based on the frequency of the preceding output symbol The method of claim 22, wherein the step of modifying the frequency of the first output symbol comprises modifying the frequency of the first output symbol based on the frequency of the succeeding output symbol.

27. The method of claim 22, wherein the step of modifying the frequency of the first output symbol comprises modifying the frequency of the first output symbol based on the frequency of the first output symbol.

28. The method of claim 1, wherein the signal property of the preceding output symbol is a first phase and the signal property of the succeeding output symbol is a second phase and further comprising the step of interrogating the output signal to determine a phase of the first output symbol.

29. The method of claim 28, wherein the step of modifying the first output symbol comprises modifying a phase of the first output symbol.

30. The method of claim 29, wherein the step of modifying the phase of the first output symbol comprises modifying the phase of the first output symbol based on the phase of the first output symbol.

31. The method of claim 29, wherein the step of modifying the phase of the first output symbol comprises modifying the phase of the first output symbol based on the phase of the succeeding output symbol.

32. The method of claim 29, wherein the step of modifying the phase of the first output symbol comprises modifying the phase of the first output symbol based on the phase of the preceding output symbol.

33. The method of claim 29, further comprising the step of further modifying the first output symbol, according to a phase of a second preceding output symbol and a phase of second succeeding output symbol.

34. The method of claim 29, wherein the step of modifying the phase of the first output symbol depends upon the amplitude of the preceding output symbol.

35. The method of claim 29, wherein the step of modifying the phase of the first output symbol depends upon the amplitude of the succeeding output symbol.

36. The method of claim 29, wherein the step of modifying the phase of the first output symbol depends upon the amplitude of the first output symbol.

37. A method for increasing the channel data rate throughput in an optical fiber communication system, the method comprising the steps of:
receiving a digital input signal, comprising a series of input pulses, each input pulse having one of two pulse levels;
creating a digital input word having n bits from the digital input signal;
converting each digital input word to a corresponding output symbol having one of $2^n$ distinct values;
generating an output signal comprising a series of output symbols;
adding a signal dependent bias to the output signal so that a linear response is generated in the optical source; and
using the optical source to transmit the output signal;
wherein a drive voltage controls the optical source and a series resistor is used to convert a nonlinear shunt current into a nonlinear voltage drop to reduce the drive voltage.

38. The method of claim 37, wherein the digital input signal is received from n separate channels, the output signal having n times higher data rate than that of one of the n separate channels.

39. The method of claim 37, wherein the digital input signal is received from a single channel.

40. The method of claim 37, wherein error correction coding is applied to the input data.

41. The method of claim 37, wherein a drive current controls the optical source.

42. The method of claim 37, wherein the step of adding a signal dependent bias comprises changing the drive current associated with the output signal by an error current.

43. The method of claim 37, wherein the step of adding a signal dependent bias comprises adjusting the drive voltage associated with the output signal by an error voltage.

44. A method for increasing the channel data rate throughput in an optical fiber communication system, the method comprising the steps of:

receiving a digital input signal, comprising a series of input pulses, each input pulse having one of two pulse levels;

creating a digital input word having n bits from the digital input signal;

converting each digital input word to a corresponding output symbol having one of $2^n$ distinct values;

generating an output signal comprising a series of output symbols;

adding a signal dependent bias to the output signal so that a linear response is generated in the optical source; and using the optical source to transmit the output signal;

wherein a drive current controls the optical source; the drive current controls a Mach-Zehnder modulator; and a series resistor is used to convert a nonlinear shunt current into a nonlinear voltage drop to reduce the drive voltage.

45. The method of claim 44, wherein the drive current controls a laser diode.

46. The method of claim 45, wherein a nonlinear element is used to shunt an error current from the drive current.

47. The method of claim 46, wherein the laser diode is a nonlinear optical modulator device.

* * * * *